(12) United States Patent
Takahashi et al.

(10) Patent No.: US 7,193,917 B2
(45) Date of Patent: Mar. 20, 2007

(54) SEMICONDUCTOR STORAGE DEVICE, TEST METHOD THEREFOR, AND TEST CIRCUIT THEREFOR

(75) Inventors: Hiroyuki Takahashi, Kanagawa (JP); Hideo Inaba, Kanagawa (JP); Syouzou Uchida, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 5 days.

(21) Appl. No.: 10/498,398

(22) PCT Filed: Dec. 10, 2002

(86) PCT No.: PCT/JP02/12930

§ 371 (c)(1),
(2), (4) Date: Jan. 4, 2005

(87) PCT Pub. No.: WO03/056566

PCT Pub. Date: Jul. 10, 2003

(65) Prior Publication Data

US 2005/0207252 A1    Sep. 22, 2005

(30) Foreign Application Priority Data

Dec. 11, 2001    (JP) .............................. 2001-377889

(51) Int. Cl.
*G11C 7/00* (2006.01)
(52) U.S. Cl. .................... 365/222; 365/233.5; 365/201
(58) Field of Classification Search ................. 365/222
See application file for complete search history.

(56) References Cited

U.S. PATENT DOCUMENTS 5,424,990 A * 6/1995 Ohsawa ...................... 365/201
5,933,381 A * 8/1999 Iwata ......................... 365/222
6,272,588 B1 * 8/2001 Johnston et al. ............. 365/201
6,275,437 B1 * 8/2001 Kim et al. ................... 365/222
6,388,934 B1 * 5/2002 Tobita ......................... 365/222

FOREIGN PATENT DOCUMENTS

| JP | 63-206994 | 8/1988 |
|----|-----------|--------|
| JP | 1-125796  | 5/1989 |
| JP | 4-74349   | 3/1992 |

* cited by examiner

Primary Examiner—Thong Q. Le
(74) Attorney, Agent, or Firm—Muirhead & Saturnelli, LLC

(57) ABSTRACT

A test method and a test circuit which enable operations to be checked when the time interval between a refresh operation and a read or write operation is forcibly reduced. Timings for a read or write operation in a normal operation mode and in a test mode are determined on the basis of an address transition detection circuit. A timing for a refresh operation in the normal operation mode is set on the basis of a normal refreshing pulse signal generated by a refresh pulse generating circuit in response to a timing signal generated by a timer circuit. A timing for a refresh operation in the test mode is set on the basis of a first testing refresh pulse generation signal generated by a first testing refresh pulse generating circuit in response to the address transition detection signal. By controlling a timing for generating the first testing refresh pulse generation signal, it is possible to generate a read or write operation and a refresh operation so that there is a predetermined time interval between these operations.

22 Claims, 15 Drawing Sheets

FIG. 12

SEMICONDUCTOR STORAGE DEVICE, TEST METHOD THEREFOR, AND TEST CIRCUIT THEREFOR

This application is a 371 of PCT/JP02/12930 filed Dec. 10, 2002.

1. Technical Field

The present invention relates to a semiconductor memory device and a method of testing the semiconductor memory device, and a test circuit.

2. Background Art

SRAMs and DRAMs are the most typical of randomly accessible semiconductor memory devices. The SRAM generally operates faster than the DRAM. Further, simply by receiving a power supply and an inputted address, an internal sequential circuit can operate in response to this change in address to execute a read or write. The SRAM is thus operated simply by receiving a simple input waveform, in contrast to the DRAM. It is thus possible to simplify a circuit that generates such an input signal waveform.

Further, the SRAM can retain data stored in memory cells without refreshing, in contrast to the DRAM. Thus, advantageously, the SRAM can be easily handled and requires only a small data retention current in a standby state because it does not require refreshing. Accordingly, the SRAM is used for various applications. However, since the SRAM generally requires six transistors per memory cell, the chip size becomes large anyhow and it disadvantageously requires higher costs than the DRAM.

On the other hand, two addresses, that is, a row address and a column address, must be separately provided to the DRAM. The DRAM further requires a RAS (row address strobe) signal and a CAS (column address strobe) signal in order to specify the points in time at which the addresses are loaded. The DRAM also requires a control circuit that periodically refreshes the memory cells. Consequently, the DRAM requires more complicated timing control than the SRAM.

Another problem with the DRAM is that the memory cells must be refreshed even when there are no external accesses, which increases power consumption. However, a DRAM memory cell can be composed of one capacitor and one transistor. Accordingly, it is relatively easy to increase the capacity of the DRAM using a small chip size. Consequently, the DRAM is more inexpensive than the SRAM if these memories are used to construct respective semiconductor memory devices of the same storage capacity.

SRAMs are now used for many of the semiconductor memory devices employed in portable equipment typified by cellylar phones. The reason will be described below. First, old cellular phones comprise only simple functions and thus do not require a semiconductor memory device of a large capacity. Second, the SRAM is easier to handle in terms of timing control than the DRAM. Third, the SRAM requires only a small standby current and consumes only low power and is thus suitable for cellular phones, for which it is desired to maximize continuous call time and continuous standby time.

Furthermore, cellular phones with a very large number of functions have emerged and the following functions have been realized: an e-mail transmitting function and a function to access various sites to acquire information on nearby restaurants and so on. Furthermore, very recent cellular phones comprise a function to access a WEB server on the Internet to simplify the contents of home pages and display it. Accordingly, like current desk top type personal computers, future cellular phones are assumed to be able to access home pages or the like on the Internet.

These functions cannot be realized simply by displaying texts as in the case of conventional cellular phones. Graphic display is essential to provision of various multimedia information to users. It is thus necessary to temporarily store a large amount of data received through a public network, in a semiconductor memory device in a cellular phone. That is, it is essential that semiconductor memory devices mounted in future cellular phones have a large capacity as in the case of DRAMs. Further, portable equipment must absolutely be small and light, so that increasing the size or weight of the equipment itself must be avoided even with an increase in the capacity of the semiconductor memory device.

As described above, as a semiconductor memory device mounted in a cellular phone, the SRAM is preferred in terms of the easiness with which it can be handled as well as power consumption. However, in terms of an increase in capacity, the DRAM is preferred. That is, the optimum semiconductor memory device for this portable equipment has a combination of advantages of both SRAM and DRAM. As such a semiconductor memory device, a "pseudo SRAM" has been proposed which employs almost the same memory cells as those of the DRAM but which can be apparently used in almost the same manner as that for the SRAM.

In contrast to the DRAM, the pseudo SRAM does not require the separate inputs of a row and column addresses and thus does not require timing signals such as RAS and CAS. The pseudo SRAM can thus be operated simply by receiving one address similarly to general-purpose SRAMs. By using as a trigger a chip enable signal corresponding to a clock of a clock synchronous semiconductor memory device, the pseudo SRAM loads the address to execute a read or write.

However, the pseudo SRAM has a memory cell structure similar to that of the DRAM and must thus be periodically refreshed. Accordingly, some pseudo SRAMs use an internal timer to activate a refresh operation at fixed time intervals regardless of external control of operations. This refresh operation is called a "self-refresh operation". Timings for generating a self-refresh operation cannot be externally controlled.

On the other hand, some pseudo SRAMs operate asynchronously. Specifically, these pseudo SRAMs execute reads and writes in response to irregular changes in control or address signals. In these pseudo SRAMs, the self-refresh operation, controlled by the internal timer, is generated independently of read or write operations irregularly performed in response to externally inputted signals. Consequently, the time intervals for these operations cannot be externally controlled.

Malfunction may occur if the self-refresh operation overlaps the read or write operation. For example, for the self-refresh operation, data to be retained may be destroyed. For the read or write operation, erroneous data or addresses may be read or written.

To prevent such malfunction, the following measure is taken: for example, if an operation is generated while another operation is being performed, the former operation is caused to stand by rather than being started until the already activated operation is completed. That is, if a read request is made during a self-refresh operation, a read operation is performed after the self-refresh operation has been completed, rather than being immediately performed.

However, the above measure may not ensure sufficient circuit operations. For example, if a timing for generating a self-refresh operation is temporarily close to a timing for generating a read or write operation, the operations may interfere with each other to cause malfunction. The following malfunction may occur: the interference between word lines, an insufficient precharge resulting from short time intervals for operations, or the disturbance of an operation by a pulse signal generated by another operation.

Accordingly, before products are shipped, it must be checked how they will operate if the time interval between a self refresh operation and a read or write operation is short.

Conventional test modes for a refresh operation are described in, for example, Japanese Laid-Open Patent Publication No. H1-125796 and Japanese Laid-Open Patent Publication (Kokai) No. H4-74379. However, these techniques only check the refresh operation itself and does not check how the device will operate if the time interval between a read or write operation and the refresh operation is short.

Thus, it is desirable to provide a test method that can check how a device will operate if the time interval between a read or write operation and a refresh operation is forcibly short.

Additionally, it is desirable to provide a semiconductor memory device that can check how a device will operate if the time interval between a read or write operation and a refresh operation is forcibly short.

Further, it is desirable to provide a test circuit that can check how a device will operate if the time interval between a read or write operation and a refresh operation is short.

SUMMARY OF THE INVENTION

The present invention is provided to solve the above problems. The present invention provides a method of controlling a semiconductor memory device having a plurality of memory cells to be refreshed, wherein a timing for a read or write operation in a normal operation mode and in a test operation mode is set using as a trigger an externally inputted signal status change detection signal that detects a change in the status of an externally inputted signal, a timing for a refresh operation in the normal operation mode is set using as a trigger a timing for generating a refresh control signal internally generated by the semiconductor memory device, and a timing for the refresh operation in the test operation mode is set using the externally inputted signal status change detection signal as a trigger so that the time interval between the timings for the refresh operation and for the read or write operation has an externally set value.

The externally inputted signal status change detection signal may be an address transition detection signal generated depending on at least one of a timing for a change in an externally inputted address and a status transition timing for a signal externally inputted that selectively activates the semiconductor memory device. The signal selectively activating the semiconductor memory device is, for example, a chip select signal.

By using the status transition timing for the address transition detection signal as a trigger to generate a testing refresh pulse signal a preset first predetermined time after the trigger, it is possible to carry out tests under a first timing condition that the refresh operation is started a first time interval after the read or write operation has been finished. The first time interval may be set to the smallest value possible for a circuit configuration.

The address transition detection signal is composed of a one shot pulse. If an end-point edge of the one shot pulse is used as a trigger, the first predetermined time may be set on the basis of the sum of the time for which a word line can be kept active and the first time interval, as well as the delay time between preset signals.

The address transition detection signal is composed of a one shot pulse. If a start-point edge of the one shot pulse is used as a trigger, the first predetermined time may be set on the basis of the pulse width of the address transition detection signal, and the sum of the time for which a word line can be kept active and the first time interval, as well as the delay time between the preset signals.

The address transition detection signal is composed of a one shot pulse. By using a start-point edge of the one shot pulse as a trigger to generate a testing refresh pulse signal a preset second predetermined time after the trigger, it is possible to carry out tests under a second timing condition that the read or write operation is started a second time interval after the refresh operation has been finished. The second time interval may be set to the smallest value possible for the circuit configuration.

The second predetermined time may be set on the basis of the time between a rising edge of the address transition detection signal and a rise in a word line for the read or write operation minus the sum of the time corresponding to a word pulse width for the self-refresh operation and the second time interval, as well as the delay time between the preset signals.

A test mode switch signal can be used to switch between the tests under the first timing condition and the tests under the second timing condition during the test operation mode.

The refresh operation in the test operation mode may be based on an address internally generated by the semiconductor memory device or the externally inputted address.

Moreover, the present invention provides a method of testing a semiconductor memory device having a plurality of memory cells to be refreshed, wherein a timing for a refresh operation in a test operation mode is set using as a trigger an externally inputted signal status change detection signal that detects a change in the status of an externally inputted signal so that the time interval between the timings for the refresh operation and for a read or write operation has an externally set value.

The externally inputted signal status change detection signal may be an address transition detection signal generated depending on at least one of a timing for a change in an externally inputted address and a status transition timing for a signal that selectively activates the semiconductor memory device. The signal selectively activating the semiconductor memory device may be, for example, a chip select signal.

By using the status transition timing for the address transition detection signal as a trigger to generate a testing refresh pulse signal a preset first predetermined time after the trigger, it is possible to carry out tests under a first timing condition that the refresh operation is started a first time interval after the read or write operation has been finished. The first time interval may be set to the smallest value possible for a circuit configuration.

The address transition detection signal is composed of a one shot pulse. If an end-point edge of the one shot pulse is used as a trigger, the first predetermined time may be set on the basis of the sum of the time for which a word line can be kept active and the first time interval as well as the delay time between preset signals.

The address transition detection signal is composed of a one shot pulse. If a start-point edge of the one shot pulse is used as a trigger, the first predetermined time may be set on the basis of the pulse width of the address transition detection signal, and the sum of the time for which a word line can be kept active and the first time interval, as well as the delay time between the preset signals.

The address transition detection signal is composed of a one shot pulse. By using a start-point edge of the one shot pulse as a trigger to generate a testing refresh pulse signal a preset second predetermined time after the trigger, it is possible to carry out tests under a second timing condition that the read or write operation is started a second time interval after the refresh operation has been finished. The second time interval may be set to the smallest value possible for the circuit configuration.

The second predetermined time may be set on the basis of the time between a rising edge of the address transition detection signal and a rise in a word line for the read or write operation minus the sum of the time corresponding to a word pulse width for the self-refresh operation and the second time interval, as well as the delay time between the preset signals.

A test mode switch signal can be performed to switch between the tests under the first timing condition and the tests under the second timing condition during the test operation mode.

The refresh operation in the test operation mode can be performed based on an address internally generated by the semiconductor memory device.

The refresh operation in the test operation mode can be performed based on the externally inputted address.

Moreover, the present invention provides a semiconductor memory device having a plurality of memory cells to be refreshed, the device comprising access control means for controlling accesses to the memory cells using as a trigger a status transition timing for an externally inputted signal status change detection signal that detects a change in the status of an externally inputted signal, refresh address generating means for automatically generating a refresh address, first refresh timing control signal generating means for automatically generating a first refresh timing control signal for determining a refresh timing in a normal operation mode, a second refresh timing control signal generating means for using the status transition timing for the externally inputted signal status change detection signal as a trigger to generate a second refresh timing control signal for determining a refresh timing in a test operation mode a preset predetermined time after the trigger, and a refresh timing switching means for selecting and supplying the first refresh timing control signal to the access control means in the normal operation mode and selecting and supplying the second refresh timing control signal to the access control means in the test operation mode, wherein the timing for the refresh operation in the test operation mode is set using as a trigger the status transition timing for the externally inputted signal status change detection signal so that the time interval between the timings for the refresh operation and for a read or write operation has an externally set value.

The refresh timing switching means may comprise operation mode switch signal generating means for generating an operation mode switch signal that switches between the normal operation mode and the test operation mode on the basis of the externally inputted signal, and first switching means for selecting the first refresh timing control signal in the normal operation mode or selecting the second refresh timing control signal in the test operation mode, on the basis of the operation mode switch signal, and supplying the selected refresh timing signal to the access control means.

The externally inputted signal status change detection signal may have an address transition detection circuit that generates an address transition detection signal depending on at least one of a timing for a change in an externally inputted address and a status transition timing for a signal that selectively activates the semiconductor memory device. The signal selectively activating the semiconductor memory device is, for example, a chip select signal.

The second refresh timing control signal generating means may use the status transition timing for the address transition detection signal as a trigger to generate a testing refresh pulse signal a preset first predetermined time after the trigger, thus carrying out tests under a first timing condition that the refresh operation is started a first time interval after the read or write operation has been finished. The first time interval may be set to the smallest value possible for a circuit configuration.

The second refresh timing control signal generating means may use an end-point edge of the one shot pulse as a trigger to generate the second refresh timing control signal the first predetermined time after the trigger, the first predetermined time corresponding to the time determined on the basis of the sum of the time for which a word line can be kept active and the first time interval as well as the delay time between preset signals.

The second refresh timing control signal generating means may use a start-point edge of the one shot pulse as a trigger, and the first predetermined time may be set on the basis of the pulse width of the address transition detection signal, and the sum of the time for which a word line can be kept active and the first time interval, as well as the delay time between the preset signals.

The second refresh timing control signal generating means may use as a trigger a start-point edge of the one shot pulse operating as the address transition detection signal to generate a testing refresh pulse signal a preset second predetermined time after the trigger, thus carrying out tests under a second timing condition that the read or write operation is started a second time interval after the refresh operation has been finished. The second time interval may be set to the smallest value possible for the circuit configuration.

The second predetermined time may be set on the basis of the time between a rising edge of the address transition detection signal and a rise in a word line for the read or write operation minus the sum of the time corresponding to a word pulse width for the self-refresh operation and the second time interval, as well as the delay time between the preset signals.

A test mode switch signal supplied by the refresh timing switch means may be inputted to the second refresh timing control signal generating means, and if the test mode switch signal specifies tests under the first timing condition, the second refresh timing control signal generating means may use the status transition timing for the address transition detection signal as a trigger to generate a first testing refresh pulse signal a preset first predetermined time after the trigger, thus carrying out tests under a first timing condition that the refresh operation is started a first time interval after the read or write operation has been finished, and if the test mode switch signal specifies tests under the second timing condition, the second refresh timing control signal generating means may use as a trigger a start-point edge of the one shot pulse operating as the address transition detection signal to generate a second testing refresh pulse signal a preset second predetermined time after the trigger, thus carrying out tests under a second timing condition that the read or write operation is started a second time interval after the refresh operation has been finished.

The test mode switch signal can be used to switch between the tests under the first timing condition and the tests under the second timing condition during the test operation mode.

The second refresh timing control signal generating means may have a first testing refresh pulse signal generating circuit that generates the first testing refresh pulse signal and a second testing refresh pulse signal generating circuit that generates the second testing refresh pulse signal. In the test mode, the refresh timing switching means may select either the first testing refresh pulse signal or the second testing refresh pulse signal on the basis of the test mode switch signal and supply the selected testing refresh pulse signal to the access control means.

The first testing refresh pulse generating circuit may use as a trigger an end-point edge of the address transition detection signal composed of a one shot pulse to generate the first testing refresh pulse signal the first predetermined time after the trigger, the first predetermined time corresponding to the time determined on the basis of the sum of the time for which a word line can be kept active and the first time interval, as well as the delay time between the preset signals.

The first testing refresh pulse generating circuit may use as a trigger a start-point edge of the address transition detection signal composed of a one shot pulse to generate the first testing refresh pulse signal the first predetermined time after the trigger, the first predetermined time corresponding to the time determined on the basis of the pulse width of the address transition detection signal, and the sum of the time for which a word line can be kept active and the first time interval, as well as the delay time between the preset signals.

The second testing refresh pulse generating circuit may use as a trigger a start-point edge of the one shot pulse operating as the address transition detection signal to generate the second testing refresh pulse signal the second predetermined time after the trigger, the second predetermined time corresponding to the time determined on the basis of the time between a rising edge of the address transition detection signal and a rise in a word line for the read or write operation minus the sum of the time corresponding to a word pulse width for the self-refresh operation and the second time interval, as well as the delay time between the preset signals.

The semiconductor memory device may further comprise externally inputted address retaining means for retaining an externally inputted address, and refresh address switching means for selecting, in the normal operation mode, a first refresh address supplied by the refresh address generating means or selecting, in the test operation mode, a second refresh address supplied by the externally inputted address retaining means.

Moreover, the present invention provides a test circuit comprising a semiconductor memory device having a plurality of memory cells to be refreshed, the device comprising testing refresh timing control signal generating means for using as a trigger an externally inputted signal status change detection signal that detects a change in the status of an externally inputted signal, to generate a testing refresh timing control signal a preset predetermined time after the trigger, the testing refresh timing control signal being used to determine a refresh timing in a test operation mode, and refresh timing switching means for selecting and supplying a normal operation refresh timing control signal to access control means of the semiconductor memory device in a normal operation mode and selecting and supplying the testing refresh timing control signal to the access control means in a test operation mode, wherein the timing for the refresh operation in the test operation mode is set using the externally inputted signal status change detection signal as a trigger so that the time interval between the timings for the refresh operation and for a read or write operation has an externally set value.

The refresh timing switching means may comprise an operation mode switch signal generating means for generating an operation mode switch signal in order to switch between the normal operation mode and the test operation mode on the basis of the externally inputted signal, and first switching means for selecting the first refresh timing control signal in the normal operation mode or selecting the second refresh timing control signal in the test operation mode and supplying the selected refresh timing control signal to the access control means.

The externally inputted signal status change detection signal may comprise an address transition detection signal generated depending on at least one of a timing for a change in an externally inputted address and a status transition timing for a signal that selectively activates the semiconductor memory device. The signal selectively activating the semiconductor memory device is, for example, a chip select signal.

The testing refresh timing control signal generating means may use the status transition timing for the address transition detection signal as a trigger to generate a testing refresh pulse signal a preset first predetermined time after the trigger, thus carrying out tests under a first timing condition that the refresh operation is started a first time interval after the read or write operation has been finished. The first time interval may be set to the smallest value possible for a circuit configuration.

The testing refresh timing control signal generating means may use as a trigger an end-point edge of the address transition detection signal composed of one shot pulse to generate the second refresh timing control signal the first predetermined time after the trigger, the first predetermined time corresponding to the time determined on the basis of the sum of the time for which a word line can be kept active and the first time interval as well as the delay time between preset signals.

The testing refresh timing control signal generating means may use as a trigger an start-point edge of the address transition detection signal composed of one shot pulse and the first predetermined time may be set on the basis of the pulse width of the address transition detection signal, and the sum of the time for which a word line can be kept active and the first time interval, as well as the delay time between the preset signals.

The testing refresh timing control signal generating means may use as a trigger a start-point edge of the one shot pulse operating as the address transition detection signal to generate a testing refresh pulse signal a preset second predetermined time after the trigger, thus carrying out tests under a second timing condition that the read or write operation is started a second time interval after the refresh operation has been finished. The second time interval may be set to the smallest value possible for the circuit configuration.

The second predetermined time may be set on the basis of the time between a rising edge of the address transition detection signal and a rise in a word line for the read or write operation minus the sum of the time corresponding to a word pulse width for the self-refresh operation and the second time interval, as well as the preset delay time between preset signals.

A test mode switch signal supplied by the refresh timing switch means may be inputted to the testing refresh timing control signal generating means, and if the test mode switch signal specifies tests under the first timing condition, the testing refresh timing control signal generating means may use the status transition timing for the address transition detection signal as a trigger to generate a first testing refresh pulse signal a preset first predetermined time after the trigger, thus carrying out tests under a first timing condition that the refresh operation is started a first time interval after the read or write operation has been finished.

If the test mode switch signal specifies tests under the second timing condition, the testing refresh timing control signal generating means may use as a trigger a start-point edge of the one shot pulse operating as the address transition detection signal to generate a second testing refresh pulse signal a preset second predetermined time after the trigger, thus carrying out tests under a second timing condition that the read or write operation is started a second time interval after the refresh operation has been finished.

The test mode switch signal can be used to switch between the tests under the first timing condition and the tests under the second timing condition during the test operation mode.

The testing timing control signal generating means may have a first testing refresh pulse signal generating circuit that generates the first testing refresh pulse signal and a second testing refresh pulse signal generating circuit that generates the second testing refresh pulse signal. In the test mode, the refresh timing switching means may select either the first testing refresh pulse signal or the second testing refresh pulse signal on the basis of the test mode switch signal and supply the selected testing refresh pulse signal to the access control means.

The first testing refresh pulse generating circuit may use as a trigger an end-point edge of the address transition detection signal composed of a one shot pulse to generate the first testing refresh pulse signal the first predetermined time after the trigger, the first predetermined time corresponding to the time determined on the basis of the sum of the time for which a word line can be kept active and the first time interval, as well as the delay time between the preset signals.

The first testing refresh pulse generating circuit may use as a trigger a start-point edge of the address transition detection signal composed of a one shot pulse to generate the first testing refresh pulse signal the first predetermined time after the trigger, the first predetermined time corresponding to the time determined on the basis of the pulse width of the address transition detection signal, and the sum of the time for which a word line can be kept active and the first time interval, as well as the preset delay time between the preset signals.

The second testing refresh pulse generating circuit may use as a trigger a start-point edge of the one shot pulse operating as the address transition detection signal to generate the second testing refresh pulse signal the second predetermined time after the trigger, the second predetermined time corresponding to the time determined on the basis of the time between a rising edge of the address transition detection signal and a rise in a word line for the read or write operation minus the sum of the time corresponding to a word pulse width for the self-refresh operation and the second time interval, as well as the preset delay time between the preset signals.

The test circuit may further comprise externally inputted address retaining means for retaining an externally inputted address, and refresh address switching means for selecting, in the normal operation mode, a first refresh address supplied by the refresh address generating means or selecting, in the test operation mode, a second refresh address supplied by the externally inputted address retaining means.

The test circuit may be built into the semiconductor memory device. Alternatively, the test circuit and the semiconductor memory device may be mounted on the same chip separately from each other.

BRIEF DESCRIPTION OF THE DRAWINGS

FIG. 12 is a flow chart showing a test procedure executed by the semiconductor memory device shown in FIG. 9;

DETAILED DESCRIPTION OF VARIOUS EMBODIMENTS OF THE INVENTION (First Embodiment)

A first embodiment of the present invention will be described below with reference to the drawings.

Figure 1:
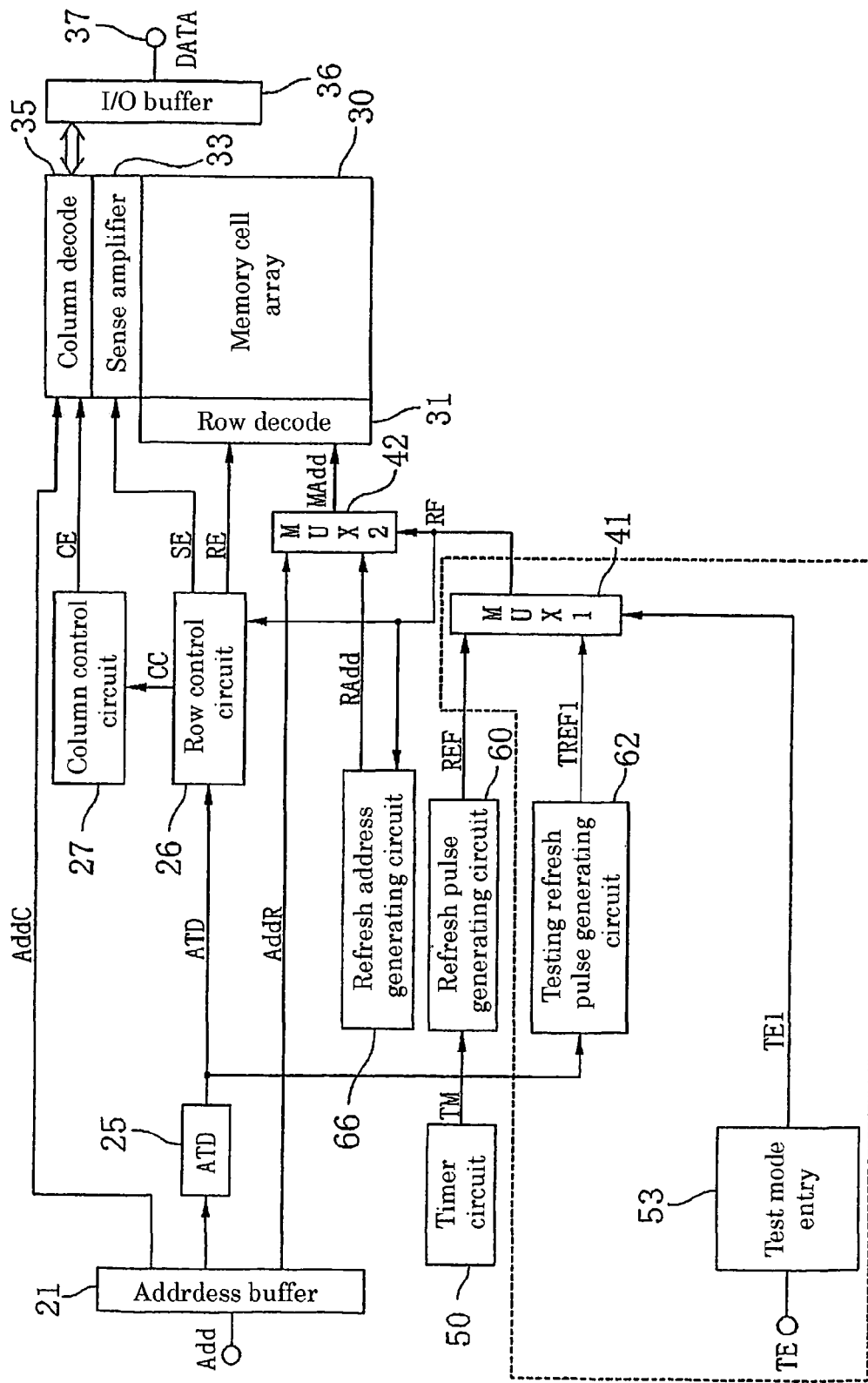
FIG. 1 is a block diagram showing the circuit configuration of a semiconductor memory device (pseudo SRAM) according to a first embodiment of the present invention.
Figure 2:
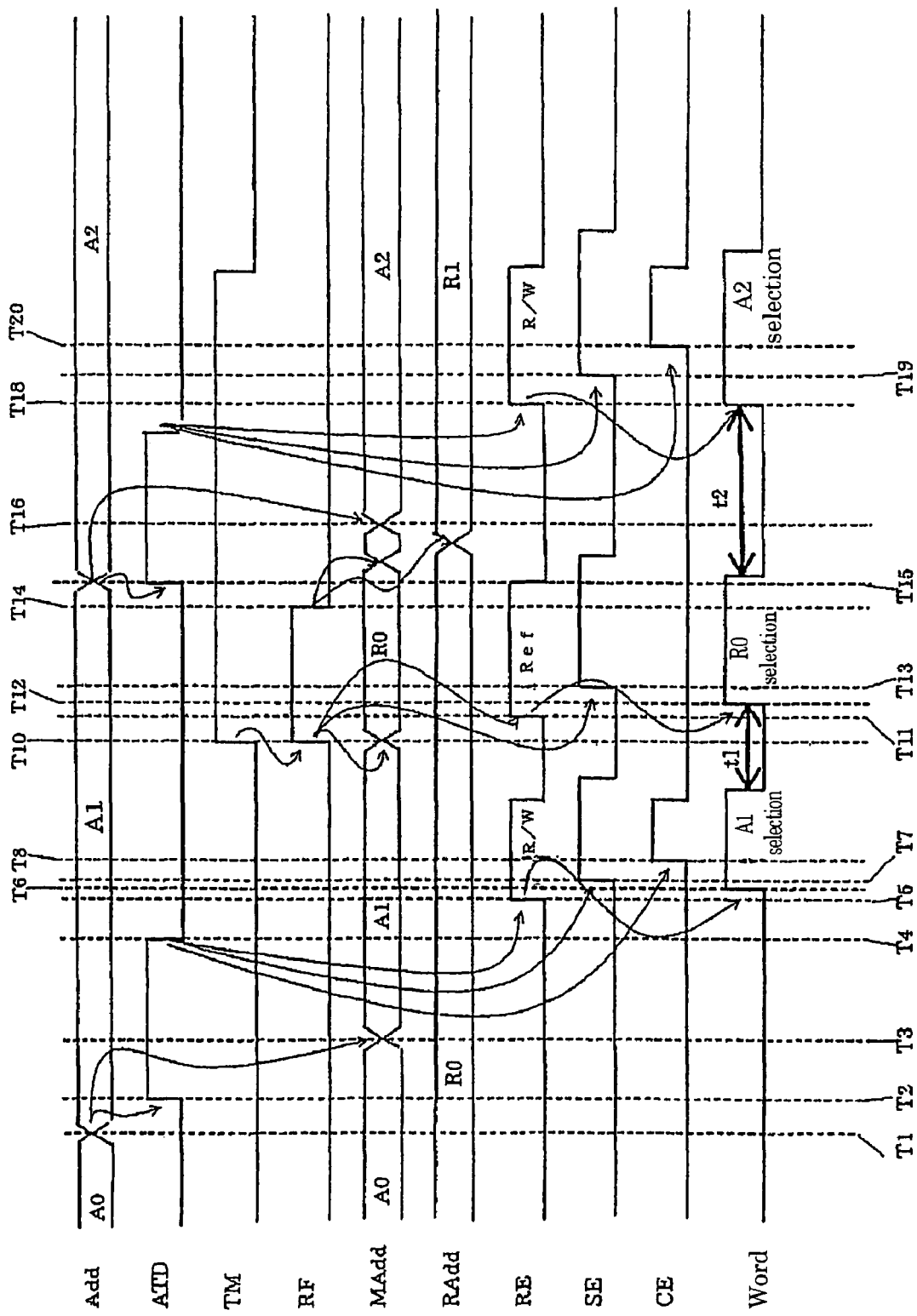
FIG. 2 is a timing chart showing a normal operation performed by the semiconductor memory device shown in FIG. 1.

FIG. 1 is a block diagram showing the circuit configuration of a semiconductor memory device (pseudo SRAM) according to the first embodiment. FIG. 2 is a timing chart showing a normal operation performed by the semiconductor memory device shown in FIG. 1. First, the circuit configuration of the semiconductor memory device (pseudo SRAM) will be described with reference to FIG. 1. With reference to FIG. 2, description will be given of the normal operation performed by the semiconductor memory device according to the present application.

A read/write address signal Add is externally inputted to an address buffer circuit 21. An address transition detecting circuit (ATD circuit) 25 is connected to the address buffer circuit 21 to receive the read/write address signal Add as an input. When at least one bit in the address data Add changes, the address transition detecting circuit 25 detects the change to output an address transition detection signal ATD.

A row control circuit 26 is connected to an output of the address transition detecting circuit (ATD circuit) 25 to generate and output a row enable signal RE, a sense enable signal SE, and a column control signal CC on the basis of the address transition detection signal ATD, outputted by the address transition detecting circuit (ATD circuit) 25. Here, the row enable signal RE is a pulse signal that rises in response to a fall in the address transition detection signal ATD and that falls a specified time later, as shown in FIG. 2. The sense enable signal SE is obtained by delaying the row enable signal RE a specified time. Although not shown, the column control signal CC is obtained by delaying a pulse signal a specified time, the pulse signal being based on a fall in the address transition detection signal ATD.

The column control circuit 27 is connected to a row control circuit 26 to receive the column control signal CC outputted by the row control circuit 26. The column control circuit 27 further delays the column control signal CC and outputs the delayed signal as the column enable signal CE.

A memory cell array 30 has a configuration similar to that of a memory cell array in a DRAM. A row decode circuit 31 connected to word lines in the memory cell array 30 is also connected to the row control circuit 26. When a row enable signal RE outputted by the row control circuit 26 changes to H, the row decode circuit 31 selectively activates a word line in the memory cell array 30 corresponding to row address data MAdd outputted by a second switching circuit (MUX2) 42.

A sense amplifier circuit 33 connected to each bit line in the memory array circuit 30 is also connected to the row control circuit 26. When a sense enable signal SE outputted by the row control circuit 26 changes to H, the sense amplifier circuit 33 activates each bit line in the memory cell array 30.

A column decode circuit 35 is connected to the previously described address buffer circuit 21 and column control circuit 27. When the column enable signal CE outputted by the column control circuit 27 changes to H, the column decode circuit 35 decode column address data Addc contained in the address data Add. The column decode circuit 35 then connects a sense amplifier corresponding to the result of the decode, to an input/output data terminal 37 via an I/O buffer 36.

A timer circuit 50 outputs timing signals TM at fixed time intervals and supplies the signals TM to a refresh pulse generating circuit 60.

The refresh pulse generating circuit 60 generates refresh timings for a normal operation. The refresh pulse generating circuit 60 is connected to an output of the timer circuit 50 to receive the timing signal TM as an input. An output of the refresh pulse generating circuit 60 is connected to the first switching circuit (MUX1) 41. Specifically, the refresh pulse generating circuit 60 supplies a normal refreshing pulse signal REF to the first switching circuit (MUX1) 41 on the basis of the timing signals TM, outputted at the fixed time intervals.

A first testing refresh pulse generating circuit 62 generates testing refresh timings for operation check tests. The first testing refresh pulse generating circuit 62 is connected to an output of the address transition detecting circuit (ATD circuit) 25. The first testing refresh pulse generating circuit 62 receives the address transition detection signal ATD as an input to generate a first testing refresh pulse signal TREF1. An output of the first testing refresh pulse generating circuit 62 is connected to the first switching circuit (MUX1) 41. Specifically, on the basis of the address transition detection signal ATD, the first testing refresh pulse generating circuit 62 supplies the first testing refresh pulse signal TREF1 to the first switching circuit (MUX1) 41.

A test mode entry circuit 53 externally controls the switching between a normal operation mode and a test mode. The test mode entry circuit 53 receives a test mode entry signal TE as an input and outputs and supplies a first operation mode switch signal TE1 to the first switching circuit (MUX1) 41.

The first switching circuit (MUX1) 41 switches a refresh timing depending on the operation mode (normal operation mode or test mode). An input of the first switching circuit (MUX1) 41 is connected to an output of the test mode entry circuit 53, an output of the refresh pulse generating circuit 60, and an output of the first testing refresh pulse generating circuit 62. The first switching circuit (MUX1) 41 receives the first operation mode switch signal TE1, the normal refreshing pulse signal REF, and the first testing refresh pulse signal TREF1 as inputs to generate a refresh timing control signal RF.

An output of the first switching circuit (MUX1) 41 is connected to the row control circuit 26, the refresh address generating circuit 66, and the second switching circuit (MUX2) 42. The first switching circuit (MUX1) 41 supplies the refresh timing control signal RF to the row control circuit 26, the refresh address generating circuit 66, and the second switching circuit (MUX2) 42. That is, in response to the first operation mode switch signal TE1, the first switching circuit (MUX1) 41 outputs as RF either a timing control signal based on the normal refreshing pulse signal REF or a timing control signal based on the first testing refresh pulse signal TREF1.

The refresh address generating circuit 66 is connected to the output of the first switching circuit (MUX1) 41 to receive the refresh timing control signal RF as an input. The output of the refresh address generating circuit 66 is connected to the second switching circuit (MUX2) 42 to supply it with a refresh address RAdd. The refresh address generating circuit 66 uses the refresh timing control signal RF as a trigger to count up the refresh address. The refresh address generating circuit 66 then supplies the refresh address to the second switching circuit (MUX2) 42.

The second switching circuit (MUX2) 42 is connected to the outputs of the address buffer circuit 21, refresh address generating circuit 66, and first switching circuit (MUX1) 41. The second switching circuit (MUX2) 42 receives the row address data AddR, the refresh address RAdd, and the refresh timing control signal RF as inputs to generate a row address MAdd that specifies a memory cell to be accessed. An output of the second switching circuit (MUX2) 42 is connected to the row decode circuit 31 to supply it with the row address MAdd. Specifically, when a self refresh operation is determined to have been activated on the basis of the logical level (0 or 1) of the refresh timing control signal RF, that is, when the logical level of the refresh timing control signal RF changes from L to H, the second switching circuit (MUX2) 42 outputs the refresh address RAdd. Otherwise, the second switching circuit (MUX2) 42 outputs the row address data AddR.

The test mode entry circuit 53 externally controls the switching between the normal operation mode and the test mode. The test mode entry circuit 53 receives the test mode entry signal TE as an input and outputs and supplies the first operation mode switch signal TE1 to the first switching circuit (MUX1) 41.

Now, separate description will be given of a test mode operation and a normal operation performed by the above described semiconductor memory device.

First, the normal operation will be described with reference to FIG. 2. In this case, the test mode entry signal TE is set to L to set the first operation mode switch signal TE1, outputted by the test mode entry circuit 53, to L. When TE=0, that is, during the normal operation, the test circuit does not operate. Accordingly, the operation of the semiconductor memory device is substantially the same as that of a semiconductor memory device not having a built-in test circuit.

First, a read and write operations will be described. At a time T1, the read/write address Add changes from "A0" to "A1". Then, the address transition detecting circuit (ATD circuit) 25 senses the change in address. At a time T2, the address transition detecting circuit (ATD circuit) 25 raises and supplies the address transition detection signal ATD to the row control circuit 26 and second switching circuit (MUX2) 42 as a positive one shot pulse signal. Here, the addresses A0 and A1 are row-based addresses. In the description of the example below, only the row-based addresses change.

Further, as the read/write address signal Add changes, the row address MAdd switches from "A0" to "A1" at a time T3. At this time, the second switching circuit (MUX2) 42 supplies the row address data AddR to the row decode circuit 31 as the row address MAdd. This is because the second switching circuit (MUX42) determines that the self refresh operation has not been activated because the refresh timing control signal RF, an output signal from the first switching circuit (MUX1) 41 is L.

Upon receiving the address transition detection signal ATD, the row control circuit 26 uses a falling edge of the address transition detection signal ATD at a time T4 as a trigger to raise the row enable signal RE at a time T5. The row control circuit 26 supplies the row decode circuit 31 with the row enable signal RE having a predetermined pulse length. Since the second switching circuit (MUX2) 42 has already inputted the row address MAdd to the row decode circuit 31, the a word line Word specified by the row address MAdd (AddR=A1) is activated synchronously with the row enable signal RE at a time T6.

The row control circuit 26 uses the falling edge of the address transition detection signal ATD at the time T4 as a trigger to raise the sense enable signal SE at a time T7. The row control circuit 26 then supplies the sense enable signal SE to the sense amplifier circuit 33 to activate it. Moreover, the row control circuit 26 uses the falling edge of the address transition detection signal ATD at the time T4 as a trigger to raise and supply the column control signal CC to the column control circuit 27. Then, the column control circuit 27 uses a timing based on the column control signal CC (and thus on the row enable signal RE) to raise and supply the column enable signal CE to the column decode circuit 35 at a time T8. A column-based address AddC is inputted to the column decode circuit 35.

Upon receiving the column enable signal CE, the column decode circuit 35 decodes the column address data AddC and connects a sense amplifier 33 corresponding to the result of the decode to the input/output data terminal 37 via the I/O buffer 36. Thus, for a read operation, data stored in a cell specified by the row address A1 in the memory cell array 30 is transmitted to the input/output data terminal 37 via the sense amplifier 33 and the I/O buffer 36. For a write operation, data present on the input/output data terminal 37 is written in the cell specified by the row address A1 in the memory cell array 30.

A predetermined time after the falling edge of the address transition detection signal ATD at the time T4, each of the row enable signal RE, column enable signal CE, and column enable signal CE falls. The read and write operations in the normal mode have been described.

Now, the self refresh operation in the normal mode will be described. The self refresh operation is activated at fixed time intervals on the basis of internally generated timings and addresses regardless of externally inputted signals.

Activation timings for the self refresh operation are generated by the timer circuit 50. At a time T10, the timer circuit 50 outputs the one shot pulse signal TM having a predetermined pulse width. Then, upon receiving the signal TM, on the basis of a rising edge of the signal TM, the refresh pulse generating circuit 60 outputs the normal refreshing pulse signal REF as a one shot pulse signal having a pulse width corresponding to the time required for one refresh operation. The refresh pulse generating circuit 60 supplies the normal refreshing pulse signal REF to the first switching circuit (MUX1) 41.

On the other hand, the refresh address RAdd is generated by the refresh address generating circuit 66. In the description below, at a time T10, when the signal TM is outputted, the refresh address generating circuit 66 is assumed to generate "R0" as the refresh address RAdd and supply it to the second switching circuit (MUX2) 42.

For the normal operation, the first switching circuit (MUX1) 41 outputs the refresh timing control signal RF on the basis of the normal refreshing pulse signal REF. In response to a rise in the refresh timing control signal RF which occurs a short time delay after the time T10, the second switching circuit (MUX2) 42 determines that the self refresh operation has been activated. Thus, the row address MAdd is switched to RAdd=R0.

In response to the rise in the refresh timing control signal RF, the row enable signal RE rises at a time T11. Since the refresh address RAdd has already been supplied to the row decode circuit 31, a word line Word specified by RAdd=R0 is activated synchronously with the row enable signal RE at a time T12.

Moreover, at a time T13, the sense enable signal SE rises to activate the sense amplifier circuit 33. Then, the memory cell connected to the activated word line Word is refreshed. Thus, the memory cell specified by the refresh address RAdd (R0) is completely refreshed.

At a time T14, the refresh timing control signal RF falls. Then, the second switching circuit (MUX2) 42 determines that the self refresh operation has been finished. The second switching circuit (MUX2) 42 thus switches the row address MAdd from the refresh address RAdd (R0) to the row address data AddR (A1). Further, a fall in the refresh timing control signal RF is inputted to the refresh address generating circuit 66. The refresh address generating circuit 66 then uses this signal as a trigger to count up the refresh address RAdd to switch it to R1.

Moreover, at a time T15, the read/write address signal Add changes from (A1) to (A2). In response to this change, at a time T16, the row address data MAdd changes from (A1) to (A2). Subsequently, a word line Word specified by the row address MAdd (AddR=A2) is activated, and the read or write operation in the normal operation mode is performed.

As described above, the read or write operation is performed independently of the self refresh operation. Accordingly, measures must be taken to prevent the operation timings from overlapping each other.

As a first measure, it is contemplated that operations may be controlled so as to avoid performing two operations at the same time.

As a second measure, it is necessary to ensure that interference-induced malfunction is prevented in spite of the short time interval between the operation timings. That is, operation checks are executed by forcedly introducing the shortest time intervals possible for the circuit configuration into operations to confirm the avoidance of malfunction.

The present invention takes the second measure. Specifically, the present invention executes operation checks on the time intervals "t1" and "t2" in FIG. 2. "t1" is the time interval in which the self refresh operation is activated immediately after the read or write operation has been completed to release the self refresh operation that has been prohibited by the first measure. Like "t2", "t1" is the time interval in which the read/write address signal "Add" changes to reduce the time interval between the self refresh operation and the read or write operation immediately after the internal timer circuit 50 has activated the self refresh operation. Values for "t1" and "t2" depend on the circuit configuration. In the first embodiment shown in FIG. 1, a condition for "t1" is generated by a first testing refresh pulse generating circuit 62. In the second embodiment, shown in FIG. 6, a condition for "t2" is generated by a second testing refresh pulse generating circuit 64.

Now, with reference to FIG. 1, a brief description will be given of an operation performed in the test mode by the semiconductor memory device according to the present embodiment. A detailed description will be given later with also reference to FIG. 3.

The test mode entry signal TE is activated and TE=H is inputted to the test mode entry circuit 53. Then, the semiconductor memory device recognizes that the test mode has been entered. That is, the semiconductor memory device is set in the test mode.

In the previously described normal operation mode, operation timings are independently provided for the read or write operation and for the self refresh operation. However, in the test mode, these operation timings are associated with one another. In the case described below, the self-refresh operation is performed a predetermined time after the read or write operation.

When the test mode entry signal TE becomes 1, the first operation mode switch signal TE1, outputted by the test mode entry circuit 53, also becomes 1. The first switching circuit (MUX1) 41, to which the first operation mode switch signal TE1 (TE1=1) is inputted, determines that the test mode has been entered. On the basis of the timing signal TM from the timer circuit 50, the first switching circuit (MUX1) 41 then deselects the normal refreshing pulse signal REF, outputted by the refresh pulse generating circuit 60. On the other hand, the first switching circuit (MUX1) 41 selects the first refresh pulse signal TREF1, outputted by the first testing refresh pulse generating circuit 62, to output it as the refresh timing control signal RF.

The pulse width of the first testing refresh pulse signal TREF1 must be equal to that of the normal refresh pulse signal REF. This is because if the operating conditions other than a parameter to be checked vary between the normal operation mode and the test mode, the effects of extra parameters must be considered. This may prevent accurate operation checks.

The first testing refresh pulse signal TREF1 rises a predetermined time (TA1') after a falling edge of the address transition detection signal ATD outputted by the address transition detection circuit (ATD circuit) 25 when the circuit 25 detects a change in the externally inputted read/write address signal Add. Accordingly, the refresh timing control signal RF, outputted by the first switching circuit (MUX1) 41, rises a predetermined time (TA1) after a falling edge of the address transition detection signal ATD. The predetermined time (TA1') is equal to the predetermined time "TA1" shown in FIG. 3 minus the sum of the time corresponding to the signal delay between the refresh timing control signal RF and the first testing refresh pulse signal TREF1.

A rise timing for the first testing refresh pulse signal TREF1, that is, the predetermined time (TA1') is preset on the basis of the time the self refresh operation is to be delayed with respect to the read or write operation. This is the subject of the test mode operation according to the present embodiment.

Figure 3:
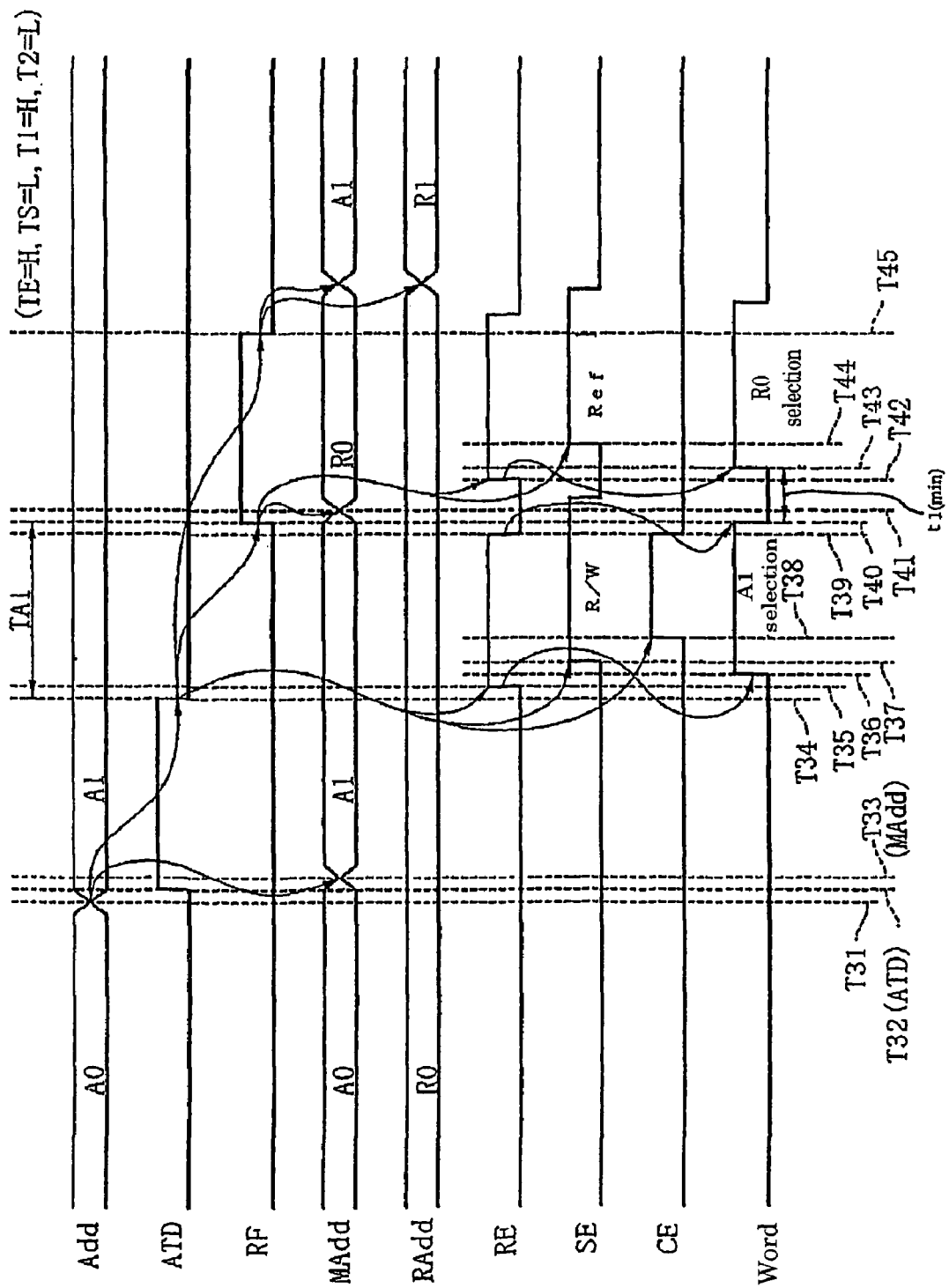
FIG. 3 is a timing chart showing a test operation performed by the semiconductor memory device shown in FIG. 1.

Specifically, the predetermined time (TA1') is based on the sum of the time for which the word line is kept active (selected), that is, the pulse width of the word line, and the shortest time interval possible for the circuit configuration represented at "t1" in FIG. 3, as well as the delay time between the signals.

The first testing refresh pulse generating circuit 62 has a function to detect a fall in the address transition detection signal ATD, outputted by the address transition detection circuit (ATD circuit) 25, and the predetermined time (TA1') after the detected fall timing, generate the first testing refresh pulse signal TREF1. The first testing refresh pulse generating circuit 62 can be constructed using a known falling edge detecting circuit and a known circuit that clocks a predetermined time.

The first testing refresh pulse generating circuit 62 may be configured to detect a rise in the address transition detection signal ATD, outputted by the address transition detecting circuit (ATD circuit) 25 and generate the first testing refresh pulse signal TREF1 the total time of the predetermined time (TA1') and the pulse width of the address transition detection signal ATD after the detected rise timing. In this case, the first testing refresh pulse generating circuit 62 can be constructed using a known rising edge detecting circuit and a known circuit that clocks a predetermined time.

Subsequently, the test mode operation will be described with reference to the timing chart in FIG. 3. At a time T31, the read/write address signal Add changes from "A0" to "A1". Then, the address transition detecting circuit (ATD circuit) 25 senses the change in address. At a time T32, the address transition detecting circuit (ATD circuit) 25 raises and supplies the address transition detection signal ATD to the row control circuit 26 as a positive one shot pulse signal.

Further, as the right/write address signal Add changes, the row address MAdd switches from "A0" to "A1" at a time T33. At this time, the second switching circuit (MUX2) 42 supplies the row address data AddR to the row decode circuit 31 as the row address MAdd. This is because the second switching circuit (MUX2) 42 determines that the self refresh operation has not been activated because the refresh timing control signal RF, an output signal from the first switching circuit (MUX1) 41 is L.

Upon receiving the address transition detection signal ATD, the row control circuit 26 uses a falling edge of the address transition detection signal ATD at a time T34 as a trigger to raise the row enable signal RE at a time T35. The row control circuit 26 supplies the row decode circuit 31 with the row enable signal RE having a predetermined pulse length. Since the second switching circuit (MUX2) 42 has already inputted the row address MAdd to the row decode circuit 31, the a word line Word specified by the row address MAdd (AddR=A1) is activated synchronously with the row enable signal RE at a time T36.

The row control circuit 26 uses the falling edge of the address transition detection signal ATD at the time T34 as a trigger to raise the sense enable signal SE at a time T37. The row control circuit 26 then supplies the sense enable signal SE to the sense amplifier circuit 33 to activate it. Moreover, the row control circuit 26 uses the falling edge of the address transition detection signal ATD at the time T34 as a trigger to raise and supply the column control signal CC to the column control circuit 27. Then, the column control circuit 27 uses a timing based on the column control signal CC (and thus based on the row enable signal RE) to raise and supply the column enable signal CE to the column decode circuit 35 at a time T38. A column-based address AddC is inputted to the column decode circuit 35.

Upon receiving the column enable signal CE, the column decode circuit 35 decodes the column address data AddC and connects the sense amplifier 33 corresponding to the result of the decode to the input/output data terminal 37 via the I/O buffer 36. Thus, for a read operation, data stored in a cell specified by the row address A1 in the memory cell array 30 is transmitted to the input/output data terminal 37 via the sense amplifier 33 and the I/O buffer 36. For a write operation, data present on the input/output data terminal 37 is written in the cell specified by the row address A1 in the memory cell array 30.

A predetermined time after the falling edge of the address transition detection signal ATD at the time T34, each of the row enable signal RE, column enable signal CE, and column enable signal CE falls. The read and write operations in the test mode have been described.

Now, the self refresh operation in the test mode will be described. The self refresh operation is activated in association with an externally inputted signal on the basis of internally generated timings and addresses.

The first testing refresh pulse generating circuit 62 detects a falling edge of the address transition detection signal ATD at the time T34. The predetermined time (TA1') after the time T34, the first testing refresh pulse generating circuit 62 generates the first testing refresh pulse signal TREF1 as a one shot pulse signal having a pulse width corresponding to the time required for one refresh operation. As previously described, the pulse width of the first testing refresh pulse signal TREF1 is set to be the same as that of the normal refreshing pulse signal REF.

Accordingly, the first testing refresh pulse signal TREF1 is supplied to the first switching circuit (MUX1) 41. Thus at a time T40, the first testing refresh pulse signal TREF1 is supplied to the second switching circuit (MUX2) 42 as the refresh timing control signal RF having the same pulse width as that of the normal refreshing pulse signal REF.

On the other hand, the refresh address RAdd is generated by the refresh address generating circuit 66. In the description below, the refresh address generating circuit 66 is assumed to generate "R0" as the refresh address RAdd and supply it to the second switching circuit (MUX2) 42.

For the test mode operation, the first switching circuit (MUX1) 41 outputs the refresh timing control signal RF on the basis of the first testing refresh pulse signal TREF1. In response to a rise in the refresh timing control signal RF at a time T40, the second switching circuit (MUX2) 42 determines at a time T41 that the self refresh operation has been activated. Thus, the row address MAdd is switched to RAdd=R0.

Furthermore, in response to the rise in the refresh timing control signal RF at the time T40, the second switching circuit (MUX2) 42 raises the row enable signal RE and supplies the row decode circuit 31 with the row enable signal having a predetermined pulse width at a time T42. Since the second switching circuit (MUX2) 42 has already inputted the refresh address RAdd to the row decode circuit 31, the word line Word specified by the row address MAdd (AddR=R0) is activated synchronously with the row enable signal RE at a time T43.

The row control circuit 26 uses the rising edge of the refresh timing control signal RF at the time T40 as a trigger to raise and supply the sense enable signal SE to the sense amplifier circuit 33 to activate it at a time T44. Thus, the memory cell specified by the refresh address RAdd (R0) is refreshed.

Subsequently at a time T45, the refresh timing control signal RF falls. Then, the second switching circuit (MUX2) 42 determines that the self refresh operation has been finished. The second switching circuit (MUX2) 42 thus switches the row address MAdd from the refresh address RAdd (R0) to the row address data AddR (A1). Further, a fall in the refresh timing control signal RF is inputted to the refresh address generating circuit 66. The refresh address generating circuit 66 then uses this signal as a trigger to count up the refresh address RAdd to switch it to R1.

The predetermined time (TA1) is based on the total time of the pulse width of a specified word line, corresponding to the time between the time T36 and the time T39, and the time interval "t1", corresponding to the time between the time T39 and the time T43, as well as the delay time between the signals. The delay time depends on the individual circuit configurations but can be pre-calculated on the basis of the circuit configuration. Accordingly, the predetermined time (TA1) can be set so that the time interval "t1", corresponding to the time between the time T39 and the time T43, has the smallest value possible for the circuit configuration.

Therefore, it is possible to carry out tests by forcedly generating a condition that the time interval between the read or write operation and the self refresh operation has the smallest value "t1" possible for the circuit configuration.

Figure 4:
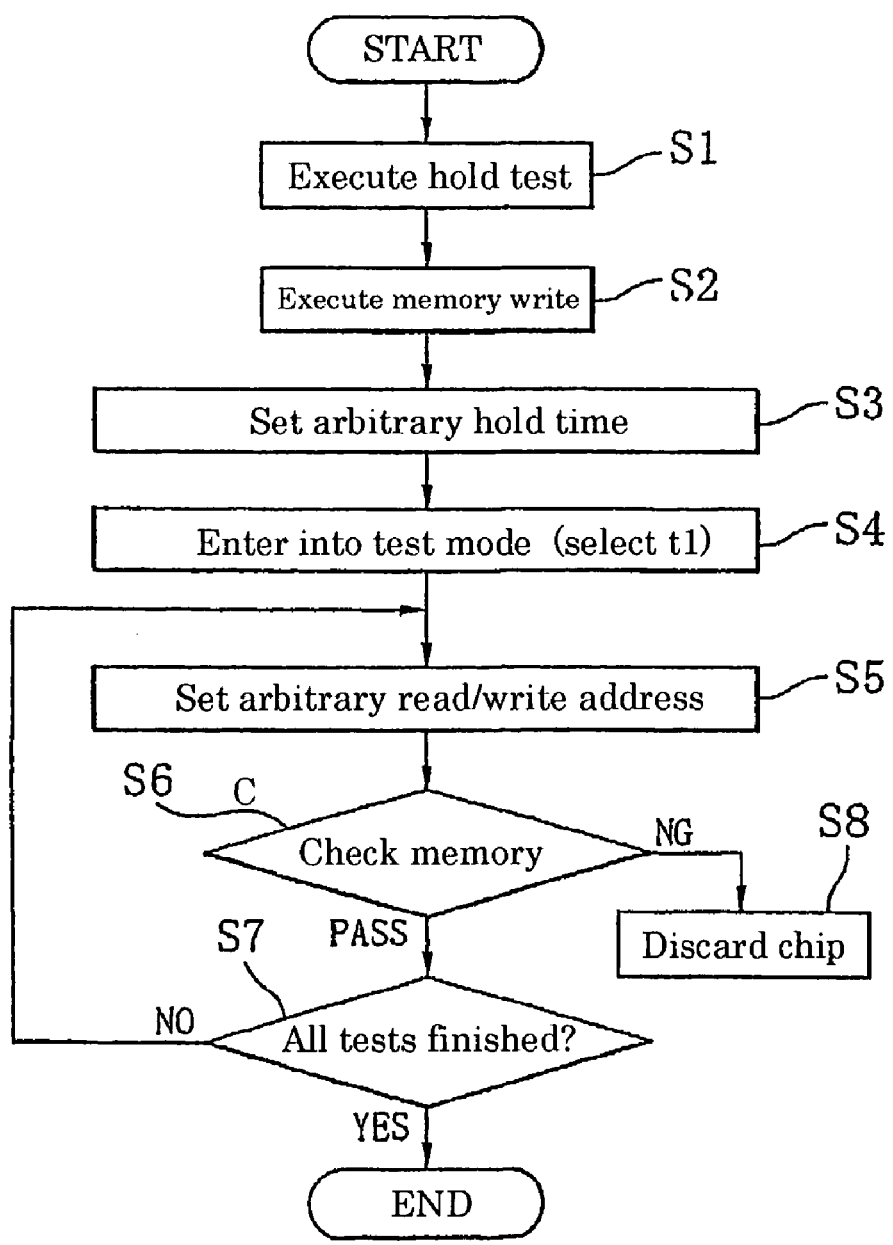
FIG. 4 is a flow chart showing a test procedure executed by the semiconductor memory device shown in FIG. 1.

Subsequently, with reference to the flow chart in FIG. 4, description will be given of a procedure of testing the semiconductor device.

First, if any chip has a fixed defect or any memory cell has an inadequate hold characteristic, it is meaningless to carry out tests on the refresh operation. Accordingly, hold tests are pre-executed (step S1). The hold tests may follow a known test procedure similar to that for tests carried out on general-purpose DRAMs.

Specifically, it is assumed that after data has been written in a memory cell in the memory cell array 30 and the refresh has been kept prohibited for a predetermined time, the data is read from this memory cell. In this case, the hold time for this memory cell is determined by adjusting the above predetermined time (that is, refresh cycle) so that the read data equals the written data. This test is carried out on all the memory cells to determine a value for a refresh cycle corresponding to a memory cell with the shortest hold time.

Then, to determine after the tests whether or not the refresh operation and read/write operation have been correctly performed on the memory cell, a test pattern is written in the memory cell array 30 (step S2).

Then, an arbitrary hold time is set (step S3). TE=1 is then inputted to raise the first operation mode switch signal TE1 to H to set the circuit in the test mode (step S4).

Then, an arbitrary read/write address signal Add is applied to the address terminal (step S5). The refresh address RAdd, generated by the internally provided refresh address generating circuit 66, is used.

The above process allows the sequential performance of a read or write operation with the row address "A1" shown in FIG. 3 and the self refresh operation with the row address "R0", which is performed the shortest time interval "t1" after the read or write operation.

Then, the data is read from the memory cell connected to the word line specified by the above address and a data check is executed (step S6). If the result of the check is "NG", the test is ended and the chip is discarded (step S8). If the result of the check is "PASS", it is determined whether or not all the tests have been finished (step S7). If the result of the determination is "NO", the procedure returns to the step S5.

Subsequently, the steps S5 to S7 are repeated until the result of the determination of whether or not all the tests have been finished is "YES". Then, when it is determined that tests have been finished on all patterns to be checked, TE is set to 0, thereby exiting from test mode to finish the tests.

In actuality, a considerably long time is required to test all possible patterns. It is thus possible to introduce regularity into the tests. Specifically, all the patterns are initially checked, and once a certain tendency is found out, any of the patterns are omitted. Techniques to test ordinary memories including DRAMs involve patterns in which defects are easy to find. It is thus possible to combine test techniques such as Marching and Gallop together. However, of course, all the patterns are desirably tested.

The first embodiment of the present invention has been described. Since the read or write operation of the semiconductor memory device is performed independently of self refresh operation, it is necessary to ensure that interference-induced malfunction is prevented in spite of the short time interval between the operation timings for the read or write operation and for the self refresh operation. The first embodiment raises the first testing refresh pulse signal TREF1 the predetermined time (TA1') after the address transition detection signal ATD has changed, to set the timing of the self refresh operation to be started so that time interval between this self refresh operation and the preceding read or write operation is shortest (t1). This makes it possible to execute operation checks by forcedly introducing the shorted time interval possible for the circuit configuration into the operations to confirm the avoidance of malfunction.

(Second Embodiment)

A second embodiment of the present invention will be described below with reference to the drawings.

Figure 5:
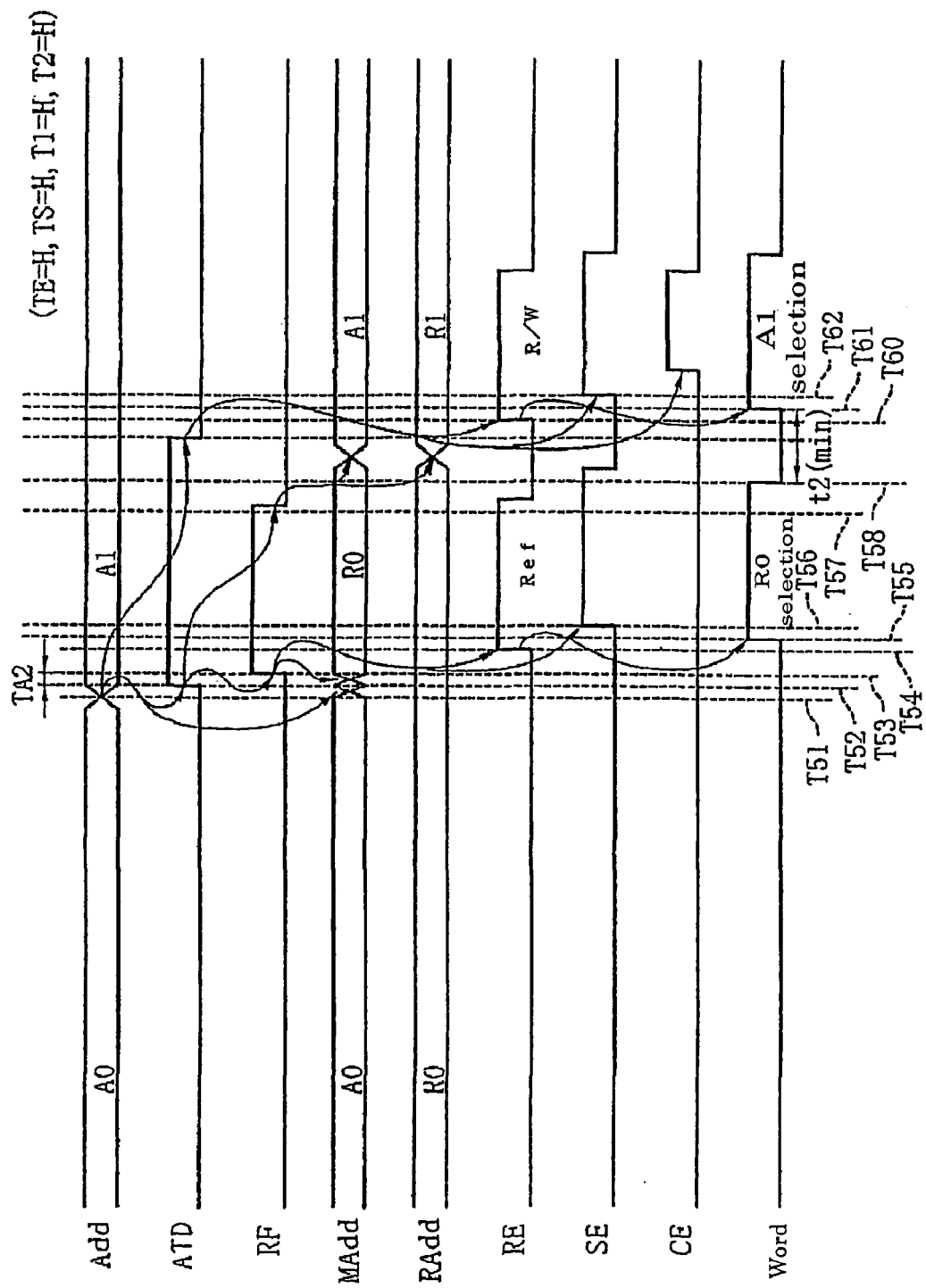
FIG. 5 is a timing chart showing an operation performed in a test mode by a semiconductor memory device according to a second embodiment of the present invention.

The circuit configuration of a semiconductor memory device according to the present embodiment is the same as that of the semiconductor memory device according to the first embodiment. Moreover, the normal mode operation of the semiconductor memory device according to the present embodiment is the same as that of the semiconductor memory device according to the first embodiment. The semiconductor memory device according to the present embodiment differs from the semiconductor memory device according to the first embodiment only in the test mode operation. Accordingly, the description of the circuit configuration and normal mode operation of the semiconductor memory device according to the present embodiment is omitted. The test mode operation will be described below with reference to FIG. 5. FIG. 5 is a timing chart showing an operation performed in the test mode by the semiconductor memory device according to the present embodiment.

The testing refresh pulse signal is referred to as the "first testing refresh pulse signal TREF1" in the first embodiment but as a "second testing refresh pulse signal TREF2" in the present embodiment.

The first embodiment sets the timing for starting the self refresh operation so as to minimize the time interval between the self refresh operation and the preceding read or write operation, by raising the first testing refresh pulse signal TREF1 the predetermined time (TA1') after a change in the address transition detection signal ATD. In contrast, the present embodiment sets the timing so as to minimize the time interval between the self refresh operation and the succeeding read or write operation, by raising the second testing refresh pulse signal TREF2 the predetermined time (TA2') after a rise in the address transition detection signal ATD. The predetermined time (TA2') corresponds to the predetermined time "TA2", shown in FIG. 5, minus the signal delay between the refresh timing control signal RF and the testing refresh pulse signal TREF2.

A rise timing for the second testing refresh pulse signal TREF2, that is, the predetermined time (TA2'), is preset on the basis of the delay in the read or write operation with respect to the refresh operation. This is the subject of the test mode operation according to the present embodiment.

Specifically, the time from a rise in the address transition detection signal ATD to a rise in a word line for a read or write operation is based on the sum of the predetermined time (TA2') and the shortest time interval possible for the circuit configuration, which interval corresponds to the word pulse width in the self refresh operation and "t2" in FIG. 5, as well as the delay time between the signals. That is, the predetermined time (TA2') is set on the basis of these conditions.

The first testing refresh pulse generating circuit 62 has a function to detect a rise in the address transition detection signal ATD, outputted by the address transition detection circuit (ATD circuit) 25, and the predetermined time (TA2') after the detected rise timing, generate the second testing refresh pulse signal TREF2. The first testing refresh pulse generating circuit 62 can be constructed using a known rising edge detecting circuit and a known circuit that clocks a predetermined time.

The test mode operation will be described below with reference to FIG. 5. At a time T51, the read/write address signal Add changes from "A0" to "A1". Then, the address transition detecting circuit (ATD circuit) 25 senses the change in address. At a time T52, the address transition detecting circuit (ATD circuit) 25 raises and supplies the address transition detection signal ATD to the row control circuit 26 as a positive one shot pulse signal.

Further, as the read/write address signal Add changes, the row address MAdd switches from "A0" to "A1". At this time, the second switching circuit (MUX2) 42 supplies the row address data AddR to the row decode circuit 31 as the row address MAdd. This is because the second switching circuit (MUX42) determines that the self refresh operation has not been activated because the refresh timing control signal RF, an output signal from the first switching circuit (MUX1) 41 is L.

Further, the first testing refresh pulse generating circuit 62 detects the rising edge of the address transition detection ATD signal at the time T52. The predetermined time (TA2') after the time T52, the second testing refresh pulse signal TREF2 is generated as a one shot pulse signal having a pulse width corresponding to the time required for one refresh operation. The pulse width of the second testing refresh pulse signal TREF2 is set equal to that of the normal refresh pulse signal REF.

The second testing refresh pulse signal TREF2 is supplied to the first switching circuit (MUX1) 41. Then at a time T53, the second testing refresh pulse signal TREF2 is supplied to the second switching circuit (MUX2) 42 as the refresh timing control signal RF having the same pulse width as that of the normal refresh pulse signal REF.

In response to a rise in the refresh timing control signal RF at the time T53, the second switching circuit (MUX2) 42 determines that the self refresh operation has been activated. Thus, the row address MAdd is switched to RAdd=R0.

Furthermore, in response to the rise in the refresh timing control signal RF at the time T53, the second switching circuit (MUX2) 42 raises the row enable signal RE and supplies the row decode circuit 31 with the row enable signal RE having a predetermined pulse width at a time T54. Since the second switching circuit (MUX2) 42 has already inputted the row address MAdd to the row decode circuit 31, the word line Word specified by the row address MAdd (AddR=R0) is activated synchronously with the row enable signal RE at a time T55.

In response to the rising edge of the refresh timing control signal RF at the time T53, the row control circuit 26 raises and supplies the sense enable signal SE to the sense amplifier circuit 33 to activate it at a time T56. Thus, the memory cell specified by the refresh address RAdd (R0) is refreshed.

Subsequently at a time T57, the refresh timing control signal RF falls. Then, the second switching circuit (MUX2) 42 determines that the self refresh operation has been finished. The second switching circuit (MUX2) 42 thus switches the row address MAdd from the refresh address RAdd (R0) to the row address data AddR (A1). Further, a fall in the refresh timing control signal RF is inputted to the refresh address generating circuit 66. The refresh address generating circuit 66 then uses this signal as a trigger to count up the refresh address RAdd to switch it to R1.

A predetermined time (T58) later, the row enable signal RE falls to finish the refresh operation on the memory cell specified by the refresh address RAdd (R0).

Subsequently, a falling edge in the address transition detection signal ATD at a time T59 is used as a trigger to raise the row enable signal RE at T60 and supply the row decode circuit 31 with the row enable signal having a predetermined pulse width. Since the second switching circuit (MUX2) 42 has already inputted the row address MAdd to the row decode circuit 31, the word line Word specified by the row address MAdd (AddR=A1) is activated synchronously with the row enable signal RE at a time T61. Then, the read or write operation is performed as in the case of Embodiment 1.

The time from the rise in the address transition detection signal ATD at the time T52 to the rise of the word line for the read or write operation at the time T61 is based on the sum of the predetermined time (TA2), the word pulse width in the self refresh operation, corresponding to the time between the time T55 and the time T58, and the shortest time interval possible for the circuit configuration, denoted by "t2", as well as the delay time between the signals. The delay time depends on the individual circuit configurations but can be pre-calculated on the basis of the circuit configuration. Accordingly, the predetermined time (TA2) can be set so that the time interval "t2", corresponding to the time between the time T58 and the time T61, has the smallest value possible for the circuit configuration.

Therefore, it is possible to carry out tests by forcedly generating a condition that the time interval between the self refresh operation and the read or write operation has the smallest value "t2" possible for the circuit configuration.

The procedure of testing the semiconductor memory device is the same as that in the first embodiment. Accordingly, its description is omitted.

The second embodiment according to the present invention has been described. Since the read or write operation of the semiconductor memory device is performed independently of its refresh operation, it is necessary to ensure that interference-induced malfunction is prevented in spite of the short time interval between the operation timings for the read or write operation and for the self refresh operation. The second embodiment raises the second testing refresh pulse signal TREF2 the predetermined time (TA2') after the address transition detection signal ATD has changed, to set the self refresh operation to be started so that time interval between this self refresh operation and the preceding read or write operation is shortest (t2). This makes it possible to execute operation checks by forcedly introducing the shorted time interval possible for the circuit configuration into the operations to confirm the avoidance of malfunction.

(Third Embodiment)

A third embodiment of the present invention will be described below with reference to the drawings.

The first embodiment generates the first testing refresh pulse signal TREF1 the predetermined time (TA1') after the address transition detection signal ATD has changed, to set the self refresh operation to be started so that time interval "t1" between this self refresh operation and the preceding read or write operation is shortest. The first embodiment thus carries out tests under the worst timing condition (hereinafter referred to as the "first worst timing condition"). The second embodiment generates the second testing refresh pulse signal TREF2 the predetermined time (TA2') after a rise of the address transition detection signal ATD, to set the self refresh operation so that time interval "t2" between this self refresh operation and the preceding read or write operation is shortest. The second embodiment thus carries out tests under the worst timing condition (hereinafter referred to as the "second worst timing condition").

Figure 6:
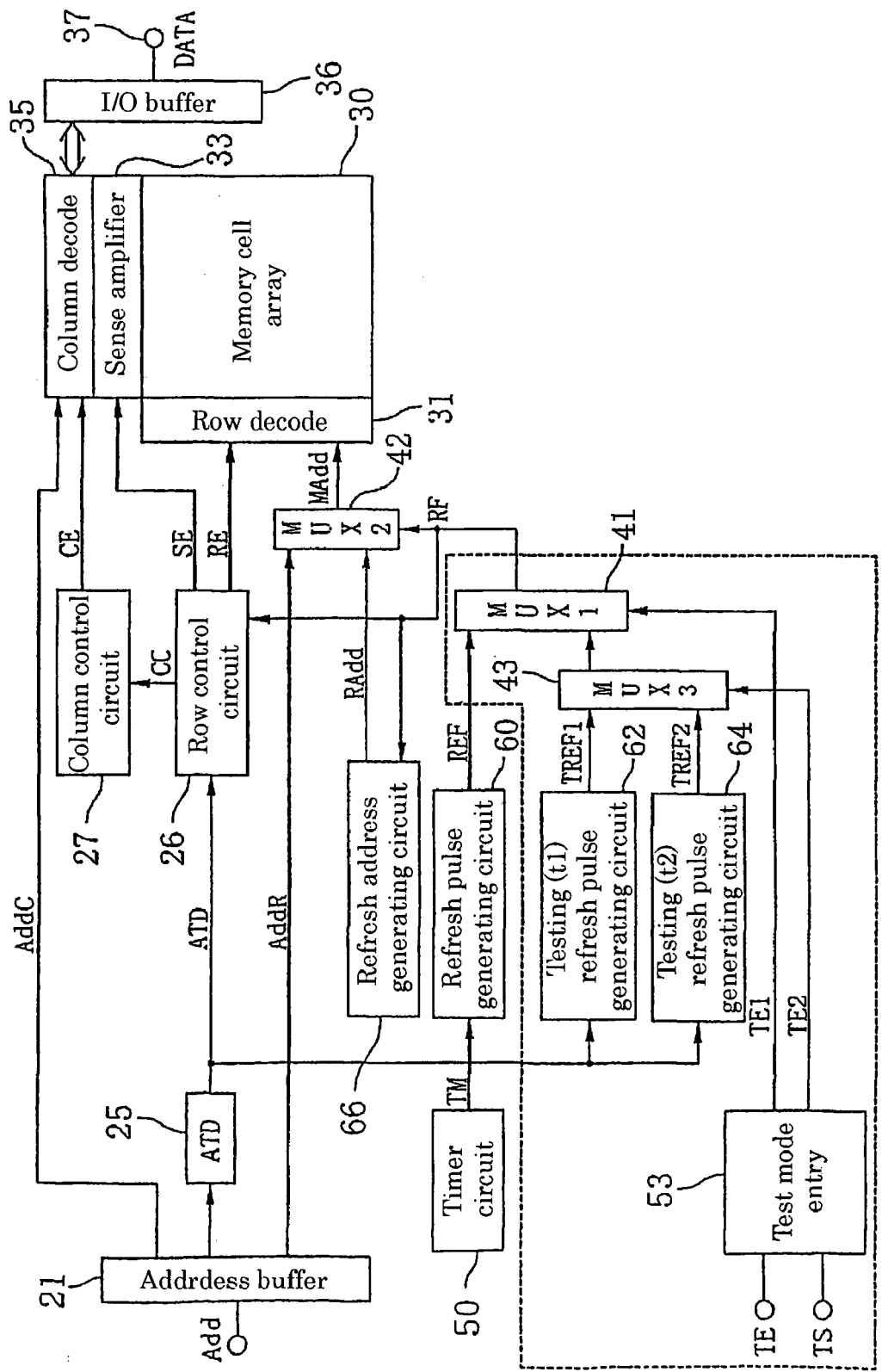
FIG. 6 is a block diagram showing the circuit configuration of a semiconductor memory device (pseudo SRAM) according to a third embodiment of the present invention.

According to the present embodiment, the circuit configurations of the semiconductor memory devices according to the first and second embodiments are partly changed so that a semiconductor memory device can perform a testing operation under either the first and second worst timing condition. The changed parts of the circuit configurations will be described below with reference to FIG. 6. FIG. 6 is a block diagram showing the configuration of a semiconductor memory device according to the third embodiment.

Specifically, this circuit is composed of a first and second testing refresh pulse generating circuits 62 and 64 to which the address transition detection signal ATD from the address transition detecting circuit (ATD circuit) 25 is inputted, and a third switching circuit (MUX3) 43 which receives a test mode selection signal TS as an input to select one of the first and second testing refresh pulse signals TREF1 and TREF2, outputted by the first and second testing refresh pulse generating circuits 62 and 64, respectively, on the basis of a second operation mode switch signal TE2 outputted by the test mode entry circuit 53, and to supply the selected testing refresh pulse signal to the first switching circuit (MUX1) 41.

The test mode entry circuit 53 receives the test mode entry signal TE as an input to output the first operation mode switch signal TE1. The test mode entry circuit 53 also receives the test mode entry signal TE as an input to output the first test mode switch signal TE1. The test mode entry circuit 53 further receives the test mode selection signal TS as an input to output the second test mode switch signal TE2 and supplies the first operation mode switch signal TE1 to the first switching circuit (MUX1) 41 and the second test mode switch signal TE2 to the third switching circuit (MUX3) 43.

In the present embodiment, in the test mode, which is set by TE=H, the first testing refresh pulse signal TREF1 is selected when TS=L. When TS=H, the second testing refresh pulse signal TREF2 is selected. Further, when TE=L, the normal operation mode is entered regardless of the test mode selection signal TS. The normal operation is the same as that in the first and second embodiments.

The above time interval "t1" is already set in the first testing refresh pulse generating circuit 62. The first testing refresh pulse generating circuit 62 uses a falling edge of the address transition detection signal ATD, outputted by the address transition detecting circuit (ATD circuit) 25, as a trigger. The predetermined time (TA1') after the falling edge, the first testing refresh pulse generating circuit 62 supplies the first testing refresh pulse signal TREF1 to the third switching circuit (MUX3) 43.

The above time interval "t2" is already set in the second testing refresh pulse generating circuit 62. The second testing refresh pulse generating circuit 62 uses a rising edge of the address transition detection signal ATD, outputted by the address transition detecting circuit (ATD circuit) 25, as a trigger. The predetermined time (TA2') after the rising edge, the second testing refresh pulse generating circuit 62 generates the second testing refresh pulse signal TREF2 and supplies it to the third switching circuit (MUX3) 43.

As described above, the test mode selection signal TS can be used to control whether to use the first testing refresh pulse signal TREF1 to carry out tests under the first worst timing condition "t1" or to use the second testing refresh pulse signal TREF2 to carry out tests under the second worst timing condition "t2". For example, the tests may be carried out first under the first worst timing condition and then under the second worst timing condition. This order may be reversed. If the tests do not require to be carried out under both worst timing conditions, only one of the testing refresh pulse signals may be used as required.

The normal mode operation of the semiconductor memory device according to the present embodiment is the same as that described in the first embodiment. If the tests are carried out under the first worst timing condition "t1" as previously described, the test mode operation is the same as that described in the first embodiment with reference to FIG. 3 except that the third switching circuit (MUX3) 43 selects and supplies the first testing refresh pulse signal TREF1, supplied by the first testing refresh pulse generating circuit 62, to the first switching circuit (MUX2) 41. If the tests are carried out under the second worst timing condition "t2", the test mode operation is the same as that described in the first embodiment with reference to FIG. 5 except that the third switching circuit (MUX3) 43 selects and supplies the second testing refresh pulse signal TREF2, supplied by the second testing refresh pulse generating circuit 64, to the first switching circuit (MUX2) 41.

Figure 7:
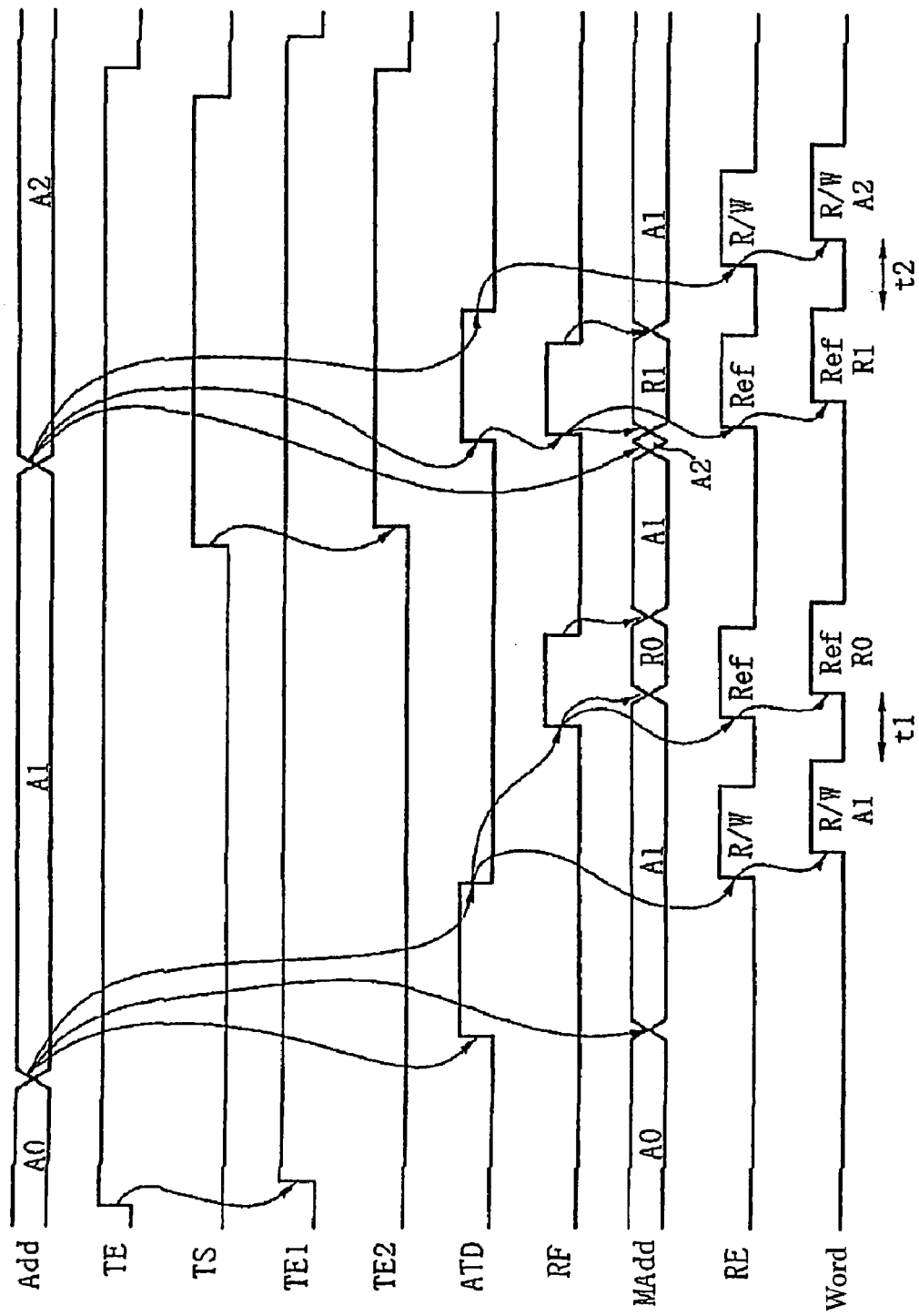
FIG. 7 is a timing chart showing an operation performed in the test mode by the semiconductor memory device shown in FIG. 6.

FIG. 7 is a timing chart showing a test operation performed by the semiconductor memory device according to the present embodiment. FIG. 7 shows an example of the relationship between each test operation and the test mode entry signal TE, test mode selection signal TS, and first and second operation mode switch signals TE1 and TE2. As shown in FIG. 7, when TE=1 and TS=0, the tests are carried out under the first worst timing condition. When TE=1 and TS=1, the tests are carried out under the second worst timing condition.

Figure 8:
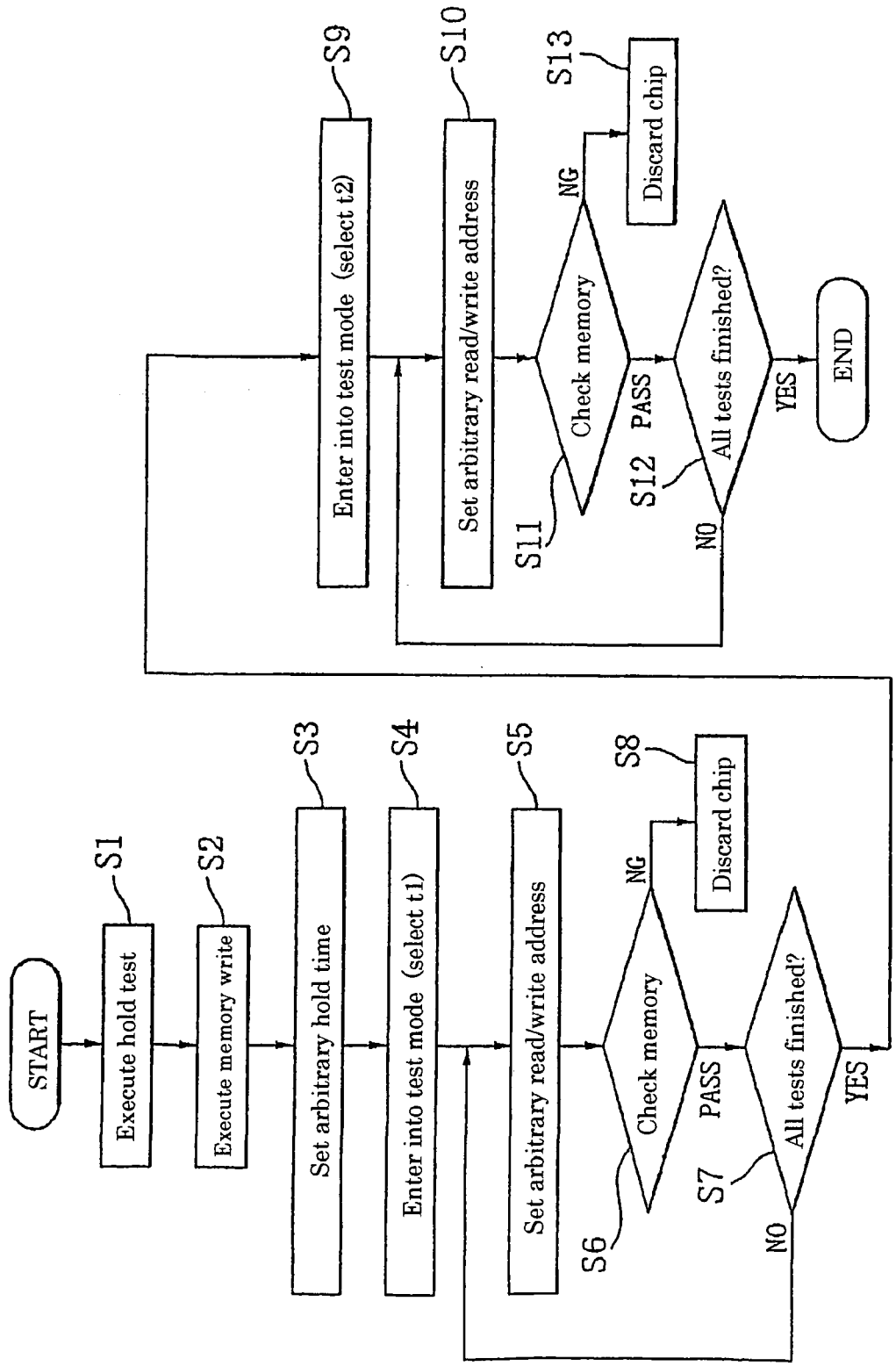
FIG. 8 is a flow chart showing a test procedure executed by the semiconductor memory device shown in FIG. 6.

Subsequently, with reference to the flow chart in FIG. 8, description will be given of a procedure of testing the semiconductor memory device. In the description of the example below, the tests are carried out first under the first worst timing condition and then under the second worst timing condition.

First, a hold test (S1) and a memory write (S2) are executed using a procedure similar to that in Embodiments 1 and 2.

Then, an arbitrary hold time is set (step S3). Next, TE=1 is inputted to raise the first operation mode switch signal TE1 to "H". The test mode selection signal TS=0 is also inputted to set the second operation mode switch signal TE2 to L. The third switching circuit (MUX3) 43 is thus set to select the first testing refresh pulse signal TREF1, outputted by the first testing refresh pulse generating circuit 62 (step S4).

Then, as in the case of Embodiment 1, a read address is set (S5) and the memory is checked (S6). If the result of the check is "NG", the test is ended and the chip is discarded (step S8). If the result of the check is "PASS", it is determined whether or not all the tests using the time interval "t1" have been finished (step S7). If the result of the determination is "NO", the procedure returns to the step S5.

Subsequently, the steps S5 to S7 are repeated until the result of the determination of whether or not all the tests have been finished is "YES".

If the result of the determination is "YES", the test mode selection signal TS is switched from L to H to raise the second operation mode switch signal TE2 to H. The third switching circuit (MUX3) 43 is thus set to select the second testing refresh pulse signal TREF2, outputted by the second testing refresh pulse generating circuit 64 (step S9).

Then, as in the case of Embodiment 1 (2), a read address is set (S10) and the memory is checked (S11). If the result of the check is "NG", the test is ended and the chip is discarded (step S13). If the result of the check is "PASS", it is determined whether or not all the tests using the time interval "t2" have been finished (step S12). If the result of the determination is "NO", the procedure returns to the step S10.

Subsequently, the steps S10 to S12 are repeated until the result of the determination of whether or not all the tests have been finished is "YES".

As described above, the third embodiment of the present invention can produce the effects of both first and second embodiments. Specifically, tests can be carried out under both first and second worst timing conditions; the first worst timing condition may be set by generating the first testing refresh pulse signal TREF1 the predetermined time (TA1') after the address transition detection signal ATD has been changed and setting the self refresh operation to be started so as to minimize the time interval "t1" between the self refresh operation and the preceding read or write operation, and the second worst timing condition may be set by generating the second testing refresh pulse signal TREF2 the predetermined time (TA2') after the address transition detection signal ATD has been changed and setting the self refresh operation to be started so as to minimize the time interval "t2" between the self refresh operation and the preceding read or write operation.

(Fourth Embodiment)

A fourth embodiment of the present invention will be described below with reference to the drawings.

In the first to third embodiments, the time interval between the write or read operation and the self refresh operation is focused on to carry out tests by forcedly generating the worst timing condition. However, in the present embodiment, not only the time interval (timing) but also the relationship between the row address for the read or write operation and the row address for the self refresh operation are focused on to carry out tests by forcedly generating the worst timing condition.

Thus, a semiconductor memory device according to the present embodiment differs from the first, second, and third embodiments in that an externally inputted row address is used for the refresh operation in the test mode. The circuit configuration of the present semiconductor memory device can be accomplished by partly changing the circuit configuration shown in FIG. 1 or 6. However, in the present embodiment, the case in which the circuit configuration shown in FIG. 6 is partly changed will be described by way of example.

Figure 9:
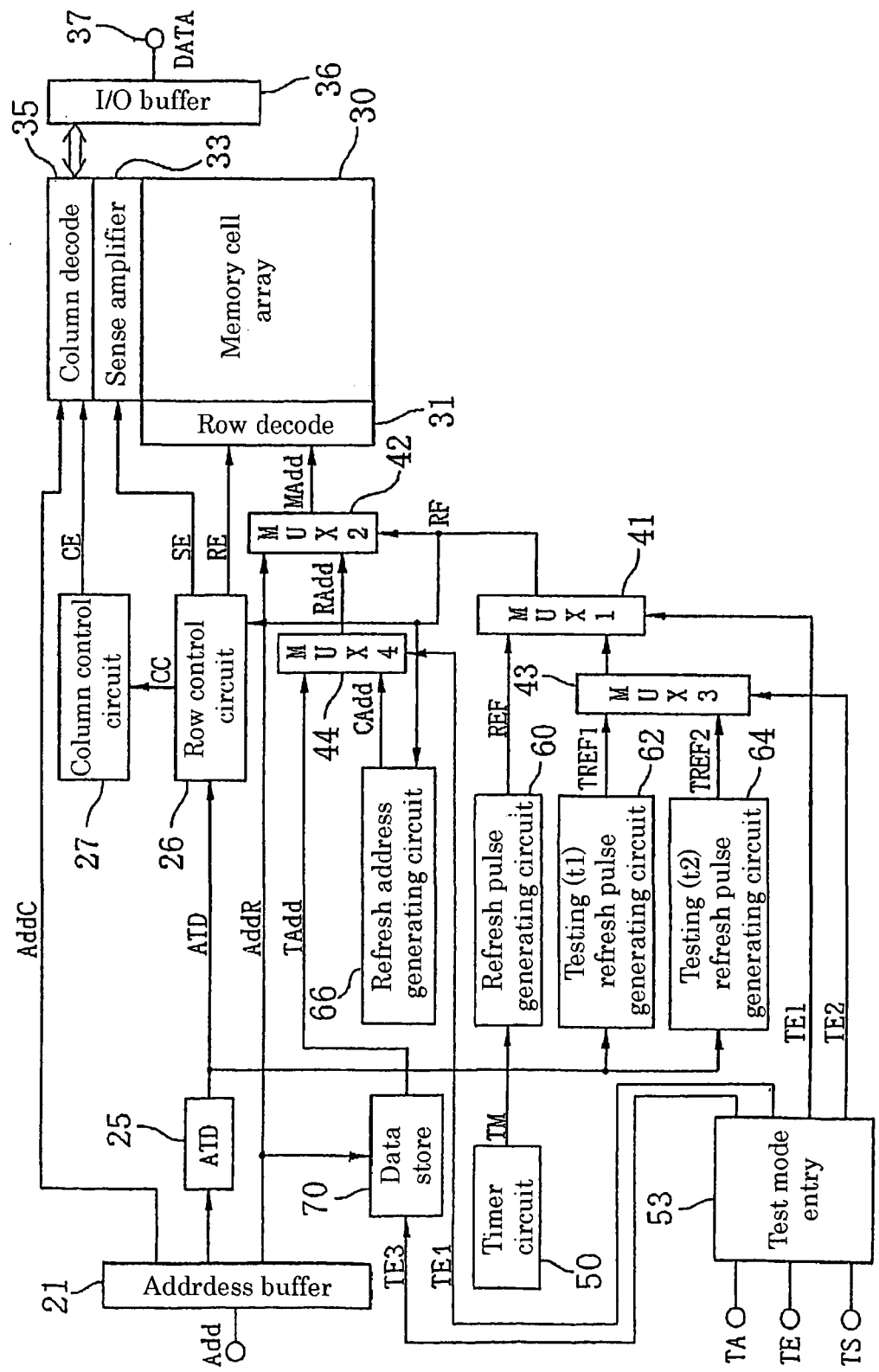
FIG. 9 is a block diagram showing the circuit configuration of a semiconductor memory device (pseudo SRAM) according to a fourth embodiment of the present invention.

FIG. 9 is a block diagram showing the configuration of the semiconductor memory device according to the present embodiment. This configuration differs from the circuit configuration shown in FIG. 6 in that a data store circuit 70 and a fourth switching circuit (MUX4) 44 are additionally provided. The test mode entry circuit 53 receives the mode entry signal TE as an input to output and supply the first operation mode switch signal TE1 to the first switching circuit (MUX1) 41. Furthermore, the test mode entry circuit 53 receives the test mode selection signal TS as an input to output and supply the second operation mode switch signal TE2 to the third switching circuit (MUX3) 43. Moreover, the test mode entry circuit 53 receives the test mode selection signal TA as an input to output and supply the third operation mode switch signal TE3 to the data store circuit 70, while outputting and supplying a fourth operation mode switch signal TE4 to the fourth switching circuit (MUX4) 44.

Description will be given of a normal operation performed by the semiconductor memory device according to the present embodiment. In the normal operation mode, the test mode entry signal TE is set to L, and the first operation mode switch signal TE1=L. Accordingly, the first switching circuit (MUX1) 41 is set to select the normal refreshing pulse signal REF, generated by the refresh pulse generating circuit 60. Further, the test mode selection signal TA is set to H, the third operation mode switch signal TE3=L, and the fourth operation mode switch signal TE4=L. Accordingly, the data store circuit 70 is set to avoid loading the row address data AddR. Further, the fourth switching circuit (MUX4) 44 is set to deselect the testing row address data TAdd from the data store circuit 70, while selecting an internal refresh address CAdd generated by the refresh address generating circuit 66.

Accordingly, as in the case of the normal operation described in the first embodiment, in the normal operation mode, the read/write operation is performed on the basis of the timing for a change in the status of the externally inputted read/write address signal Add and address transition detection signal ATD. The refresh operation is performed on the basis of the timing for the normal refreshing pulse signal REF, generated by the internal refresh pulse generating circuit 60, and the internal refresh address CAdd, generated by the refresh address generating circuit 66.

Figure 10:
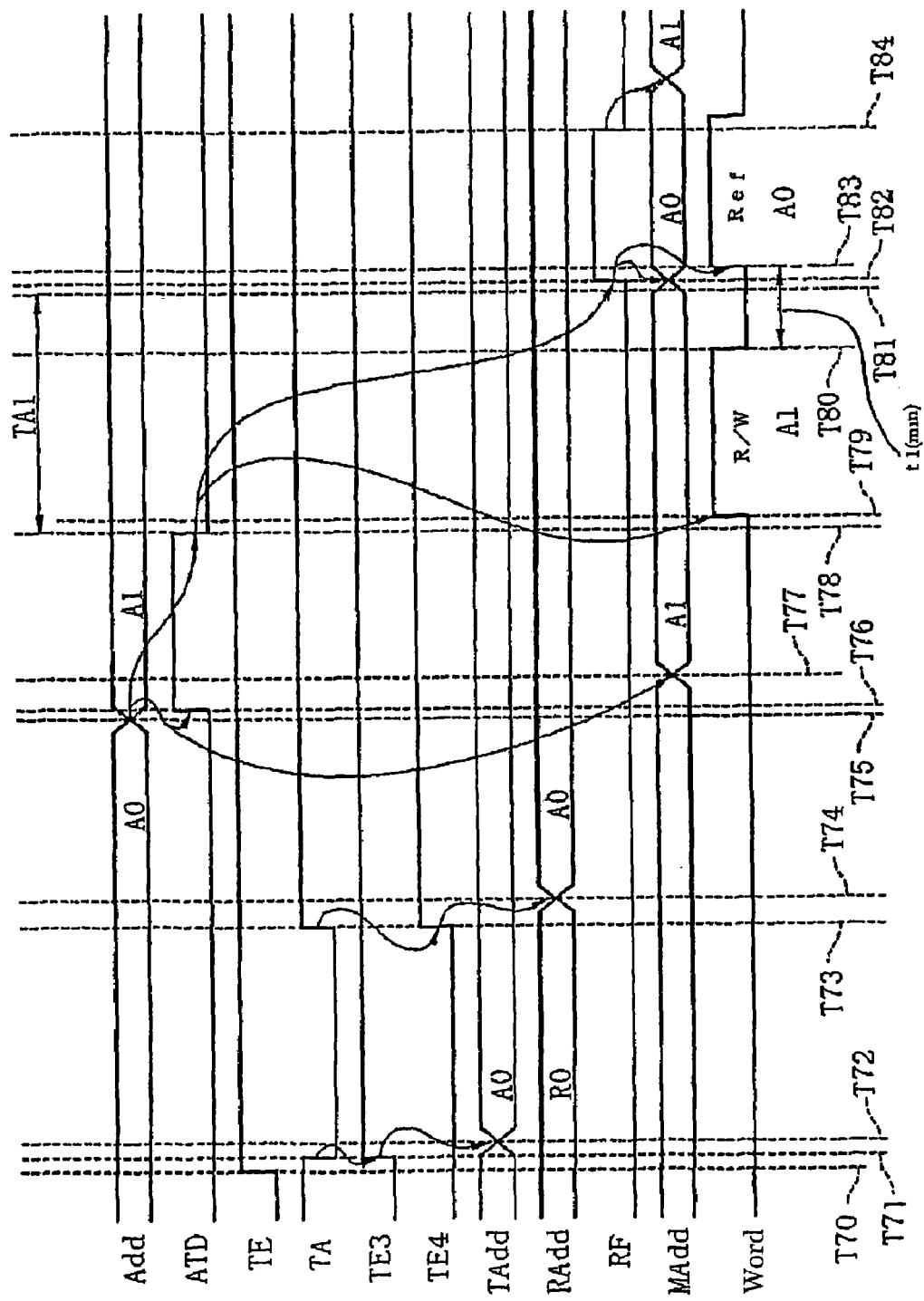
FIG. 10 is a timing chart showing an operation performed in the test mode by the semiconductor memory device shown in FIG. 9.
Figure 11:
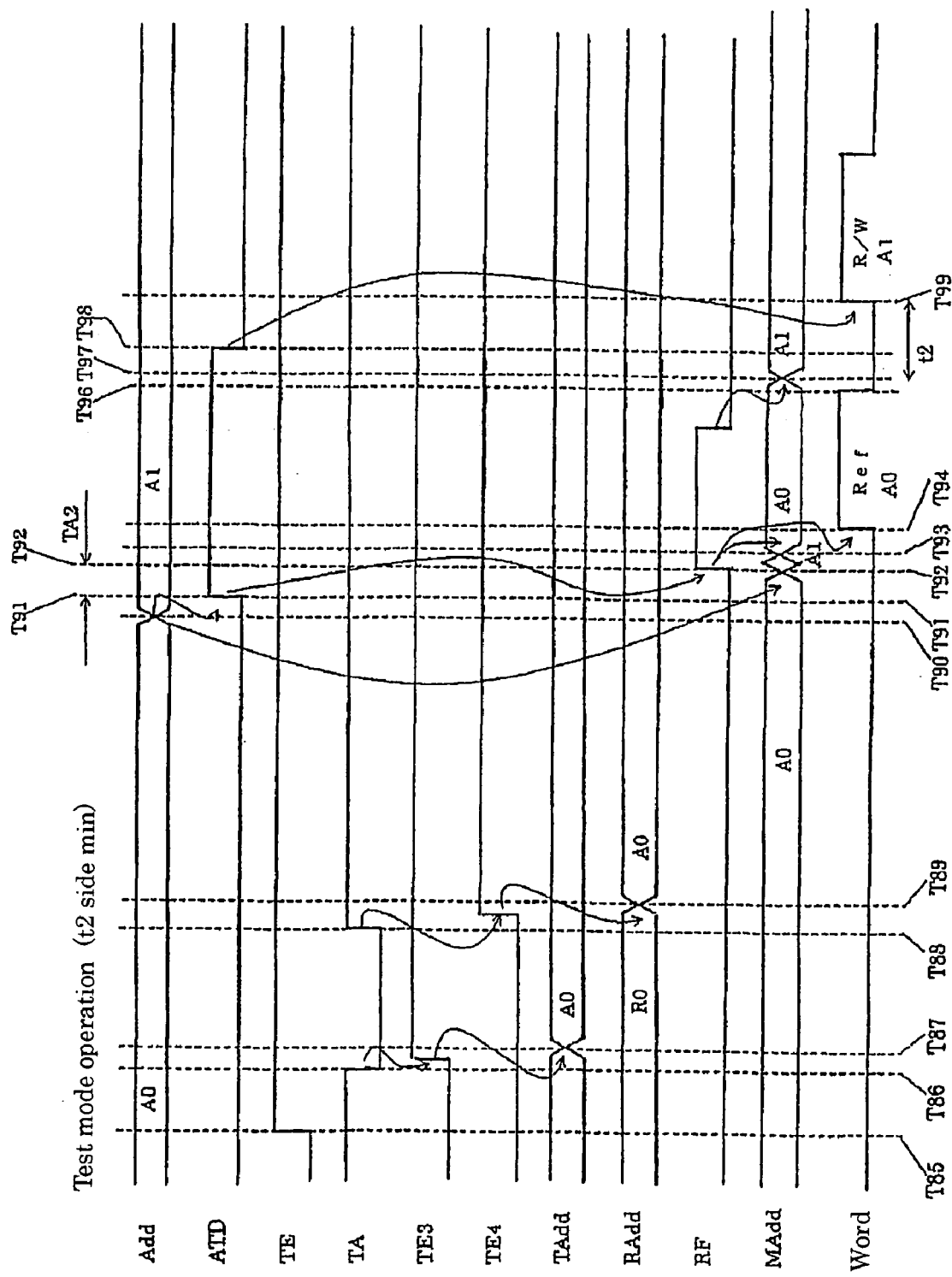
FIG. 11 is a timing chart showing the operation performed in the test mode by the semiconductor memory device shown in FIG. 9.

Next, the test mode operation will be described. The test mode operation includes the test operation performed under the first worst timing condition and the test operation performed under the second worst timing condition, as described in the Embodiment 3. FIG. 10 is a timing chart illustrating the test operation performed under the first worst timing condition. FIG. 11 is a timing chart illustrating the test operation performed under the second worst timing condition. First, with reference to FIG. 10, description will be given of the test operation performed under the first worst timing condition. Subsequently, with reference to FIG. 11, description will be given of the test operation performed under the second worst timing condition.

As shown in FIG. 10, at a time T70, the test mode entry signal TE is set to H, and the test entry circuit 53 enters the test mode. Subsequently, the signal TE2 generated from the inputted first test mode selection signal TS=L is recognized as an operation mode switch signal and supplied to the third switching circuit (MUX3) 43. Then at a time T71, the second test mode selection signal TA falls to L. The test entry circuit 53 senses this fall to raise the third operation mode switch signal TE3 to H. In response to a rise in the third operation mode switch signal TE3, the data store circuit 70 loads row address data AddR "A0" externally inputted via the address buffer circuit 21. The data store circuit 70 then supplies the address data "A0" to the fourth switching circuit (MUX4) 44 as the testing row address data TAdd.

At a time T73, the test mode selection signal TA rises to H. The test entry circuit 53 senses this rise to raise the fourth operation mode switch signal TE4 to H. In response to a rise in the fourth operation mode switch signal TE4, the fourth switching circuit (MUX4) 44 is set to deselect refresh address CAdd "R0" generated by the refresh address generating circuit 66, while selecting testing row address data TAdd "A0" outputted by the data store circuit 70. The testing row address data TAdd "A0" is supplied to the second switching circuit (MUX2) 42 as refresh address RAdd "A0" (time T74).

At a time T75, the externally inputted read/write address signal Add changes from "A0" to "A1". The address transition detection circuit (ATD circuit) 25 senses the change in address to raise the address transition detection signal ATD at a time T76. The address transition detection circuit (ATD circuit) 25 supplies the address transition detection signal ATD to the row control circuit 26 as a positive one shot pulse signal. Then, the read or write operation is performed on the memory cell specified by the address A0 as in the case of Embodiments 1 to 3.

Now, the self refresh operation in the test mode will be described. The self refresh operation is activated in association with an externally inputted signal on the basis of internally generated timings and addresses.

The first testing refresh pulse generating circuit 62 detects a falling edge of the address transition detection signal ATD at the time T78. The predetermined time (TA1') after the time T78, the first testing refresh pulse generating circuit 62 generates the first testing refresh pulse signal TREF1 as a one shot pulse signal having a pulse width corresponding to the time required for one refresh operation. As previously described, the pulse width of the first testing refresh pulse signal TREF1 is set to be the same as that of the normal refreshing pulse signal REF.

Accordingly, the first testing refresh pulse signal TREF1 is supplied to the first switching circuit (MUX1) 41 via the third switching circuit (MUX3) 43. Thus at a time T81, the first testing refresh pulse signal TREF1 is supplied to the second switching circuit (MUX2) 42 as the refresh timing control signal RF having the same pulse width as that of the normal refreshing pulse signal REF.

The fourth switching circuit (MUX4) 44 has selected the testing row address data TAdd, supplied by the data store circuit 70. Accordingly, the testing row address data TAdd "A0" has already been supplied to the second switching circuit (MUX2) 42 as the refresh address RAdd "A0". The second switching circuit (MUX2) 42 uses a rise in the refresh timing control signal RF at a time T81 as a trigger to deselect row address data AddR=A1, while selecting the refresh address RAdd "A0". At a time T82, the row address MAdd switches from "A1" to "A0".

Furthermore, in response to the rise in the refresh timing control signal RF at the time T81, the second switching circuit (MUX2) 42 raises the row enable signal RE (not shown) and supplies the row decode circuit 31 with the row enable signal having a predetermined pulse width. Since the second switching circuit (MUX2) 42 has already inputted the refresh address MAdd=A0 to the row decode circuit 31, the word line Word specified by the address TAdd=A0 to refresh the memory cell at a time T79.

Subsequently at a time T84, the refresh timing control signal RF falls. Then, the second switching circuit (MUX2) 42 determines that the self refresh operation has been finished. The second switching circuit (MUX2) 42 thus switches the row address MAdd from TAdd=A0 to the row address data AddR (A1).

As in the case of the first and third embodiments, the predetermined time (TA1) is based on the total time of the pulse width of the specified word line, corresponding to the time between the time T79 and the time T80, and the time interval "t1", corresponding to the time between the time T80 and the time T83, as well as the delay time between the signals. Accordingly, tests can be carried out by forcedly generating a condition that the time interval between the read or write operation and the self refresh operation has the smallest value possible for the circuit configuration.

Now, with reference to FIG. 11, description will be given of the test operation performed under the second worst timing condition. The process between the entry into the test mode (T85) and the loading of the testing row address data TAdd "A0" (T89) is the same as that of the test operation performed under the first worst timing condition.

At a time T90, the read/write address signal Add changes from "A0" to "A1". The address transition detection circuit (ATD circuit) 25 senses the change in address to raise the address transition detection signal ATD at a time T91. The address transition detection circuit (ATD circuit) 25 supplies the address transition detection signal ATD to the row control circuit 26 as a positive one shot pulse signal.

Furthermore, the second testing refresh pulse generating circuit 64 detects a rising edge of the address transition detection signal ATD at the time T91. The predetermined time (TA2') after the time T91, the second testing refresh pulse generating circuit 64 generates the second testing refresh pulse signal TREF2 as a one shot pulse signal having a pulse width corresponding to the time required for one refresh operation.

The second testing refresh pulse signal TREF2 is supplied to the first switching circuit (MUX1) 41 via the third switching circuit (MUX3) 43. Thus at a time T92, the second testing refresh pulse signal TREF2 is supplied to the second switching circuit (MUX2) 42 as the refresh timing control signal RF having the same pulse width as that of the normal refreshing pulse signal REF.

In response to a rise in the refresh timing control signal RF at the time T92, the second switching circuit (MUX2) 42 determines that the refresh operation has been activated. The second switching circuit (MUX2) 42 then selects the testing row address data TAdd=A0, outputted by the data store circuit 70 and supplied via the fourth switching circuit (MUX4) 44 as the refresh address RAdd. Thus, the row address MAdd is switched to A0.

Furthermore, in response to the rise in the refresh timing control signal RF at the time T92, the second switching circuit (MUX2) 42 raises the row enable signal RE (not shown) and supplies it to the row decode circuit 31. Since the second switching circuit (MUX2) 42 has already inputted the row address MAdd to the row decode circuit 31, the word line Word specified by the row address MAdd (TAdd=A0) is activated.

Then, the memory cell specified by the testing row address TAdd (A0) is refreshed as in the case of Embodiments 1 to 3.

Then, a falling edge of the address transition detection signal ATD at a time T98 is used as a trigger to raise and supply the row enable signal RE to the row decode circuit 31. Since the second switching circuit (MUX2) 42 has already inputted the refresh address MAdd to the row decode circuit 31, the word line Word specified by the row address MAdd (AddR=A1) is activated at T99. Thereafter, the read and write operation is performed as in the case of Embodiments 1 to 3.

As in the case of Embodiments 2 and 3, the time from the rise in the address transition detection signal ATD at the time T91 to the rise in the word line for the read or write operation at the time T99 is based on the sum of the predetermined time (TA2), the pulse width in the self refresh operation, corresponding to the time between the time T94 and the time T96, and the shortest time interval possible for the circuit configuration, denoted by "t2", as well as the delay time between the signals.

Therefore, it is possible to carry out tests by forcedly generating a condition that the time interval between the self refresh operation and the read or write operation has the smallest value "t2" possible for the circuit configuration.

As described above, in the test mode, not only the read or write operation but also the self refresh operation are performed on the basis of the externally inputted refresh address. Consequently, the relationship of the row address between the read or write operation and the self refresh operation can be arbitrarily controlled externally. Specifically, the read or write address "A1" in FIGS. 3 and 5 and refresh address "R0" can be arbitrarily controlled externally.

The operation of the semiconductor memory device according to the present embodiment is different from the operation of the semiconductor memory device according to the third embodiment mainly in that the self refresh operation in the test mode is performed on the basis of the testing refresh address TAdd, externally inputted and supplied via the data store circuit 70, that is, the externally inputted refresh address. Accordingly, by setting, as the relationship between the read or write address "A1" and the refresh address "A0", the worst address condition, for example, a row address specifying two adjacent word lines, tests can be carried out under the worst timing condition but also under the worst address condition.

Figure 12:
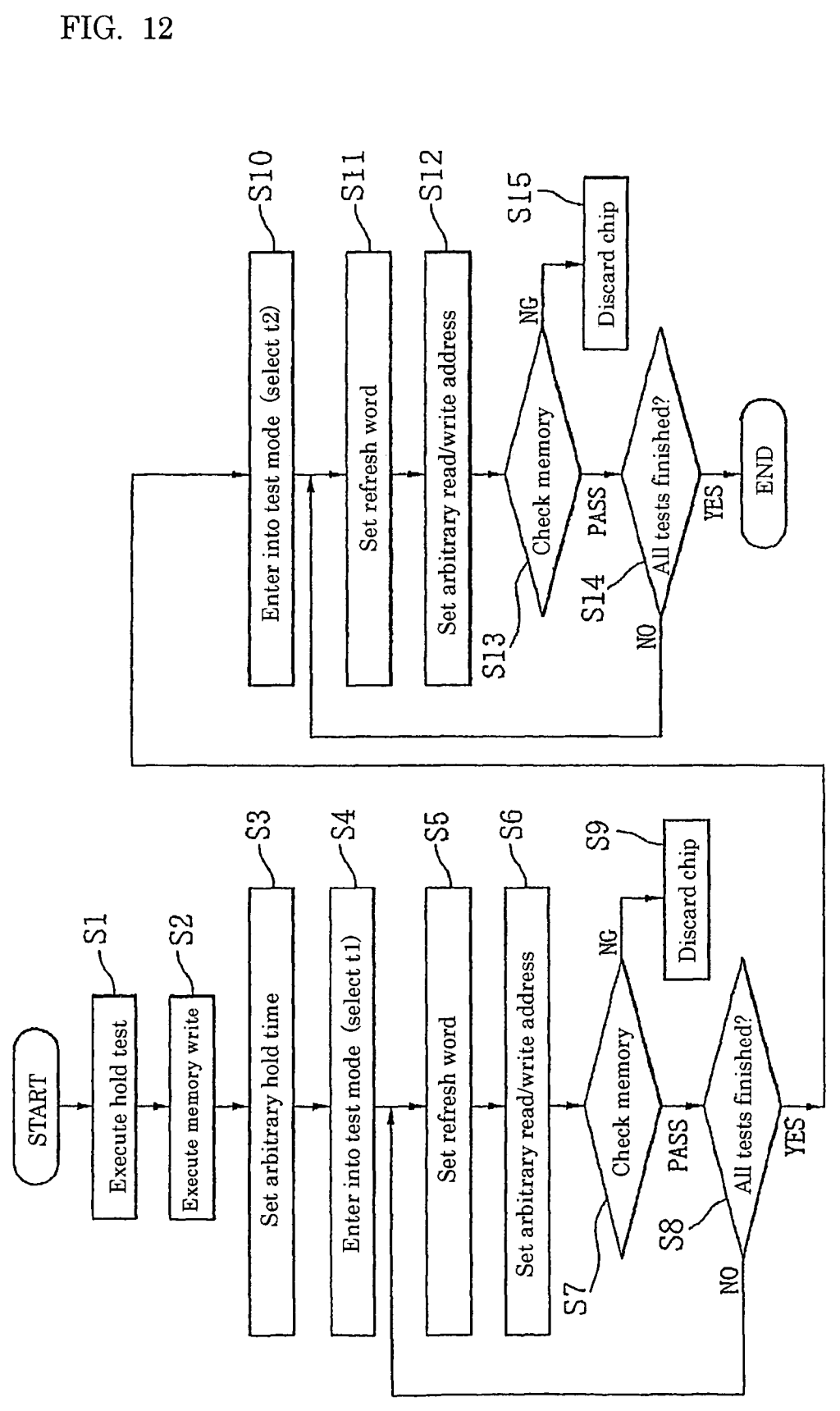

Subsequently, with reference to the flow chart in FIG. 12, description will be given of a procedure to test the semiconductor memory device. In the description below, tests are first conducted under the first worst timing condition and then under the second worst timing condition.

First, a hold test (S1) and a memory write (S2) are carried out as in the case of Embodiments 1 and 2. Then, the test mode is entered under the first worst timing condition as in the case of Embodiment 3 (S4).

Then, the address signal TA is switched from H to L, and the third operation mode switch signal TE3 is raised to H. The data store circuit 70 then loads the row address AddR (testing refresh address data), outputted by the address buffer circuit 21. The data store circuit 70 then supplies the row address AddR to the fourth switching circuit (MUX4) 44 as the testing row address data TAdd (step S5).

Then, an arbitrary read/write address signal Add is applied to the address terminal (step S6).

The above process performs a read or write operation with the row address "A1" shown in FIG. 3, and at the minimum time interval "t1" later, performs a self refresh operation with the row address "R0".

Then, data is read from the memory cell connected to the word line specified by the above address and is then checked (step S7). If the result of the check is "NG", the tests are ended and the chip is discarded (step S9). On the other hand, if the result of the check is "PASS", it is determined whether or not all the tests have been finished (step S8). If the result of the determination is "NO", the procedure returns to the step S5.

Subsequently, the steps S5 to S8 are repeated until the result of the determination of whether or not all the tests have been finished is "YES".

If the result of the determination is "YES", then the test mode selection signal TS is switched from L to H and the second operation mode switch signal TE2 is raised to H. The third switching circuit (MUX3) 43 is then set to select the second testing refresh pulse signal TREF2, outputted by the second testing refresh pulse generating circuit 64.

Then, as in the case of the step S5, the testing refresh address data AddR is supplied to the fourth switching circuit (MUX4) 44 as the testing row address data TAdd (step S11).

Then, an arbitrary read/write address signal Add is applied to the address terminal (step S12).

The above process performs a self refresh operation with the row address "R0" shown in FIG. 5, and at the minimum time interval "t2" later, performs a read or write operation with the row address "A1".

Then, data is read from the memory cell connected to the word line specified by the above address and is then checked (step S13). If the result of the check is "NG", the tests are ended and the chip is discarded (step S15). On the other hand, if the result of the check is "PASS", it is determined whether or not all the tests have been finished (step S14). If the result of the determination is "NO", the procedure returns to the step S11.

Subsequently, the steps S11 to S14 are repeated until the result of the determination of whether or not all the tests have been finished is "YES".

As described above, the fourth embodiment according to the present invention produces the same effects as those of the first to third embodiments. Furthermore, according to the fourth embodiment, the tests can be carried out by forcedly generating the worst address condition also taking into account the relationship between the row address for the read or write operation and the row address for the self refresh operation. That is, the tests can be carried out by forcedly generating not only the worst timing condition but also the worst address condition.

(Fifth Embodiment)

Figure 13:
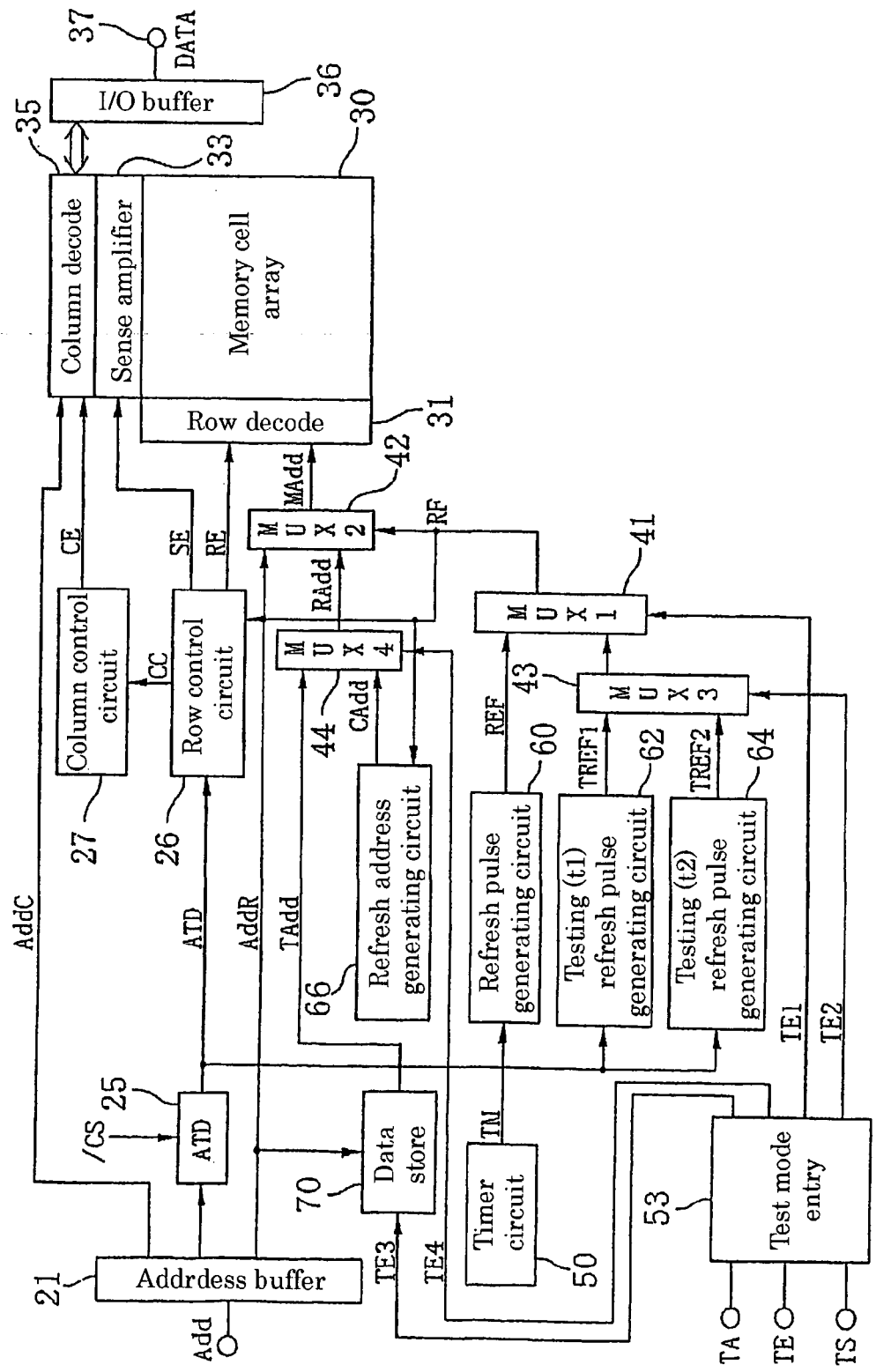
FIG. 13 is a block diagram showing the circuit configuration of a semiconductor memory device (pseudo SRAM) according to a fifth embodiment of the present invention.
Figure 14:
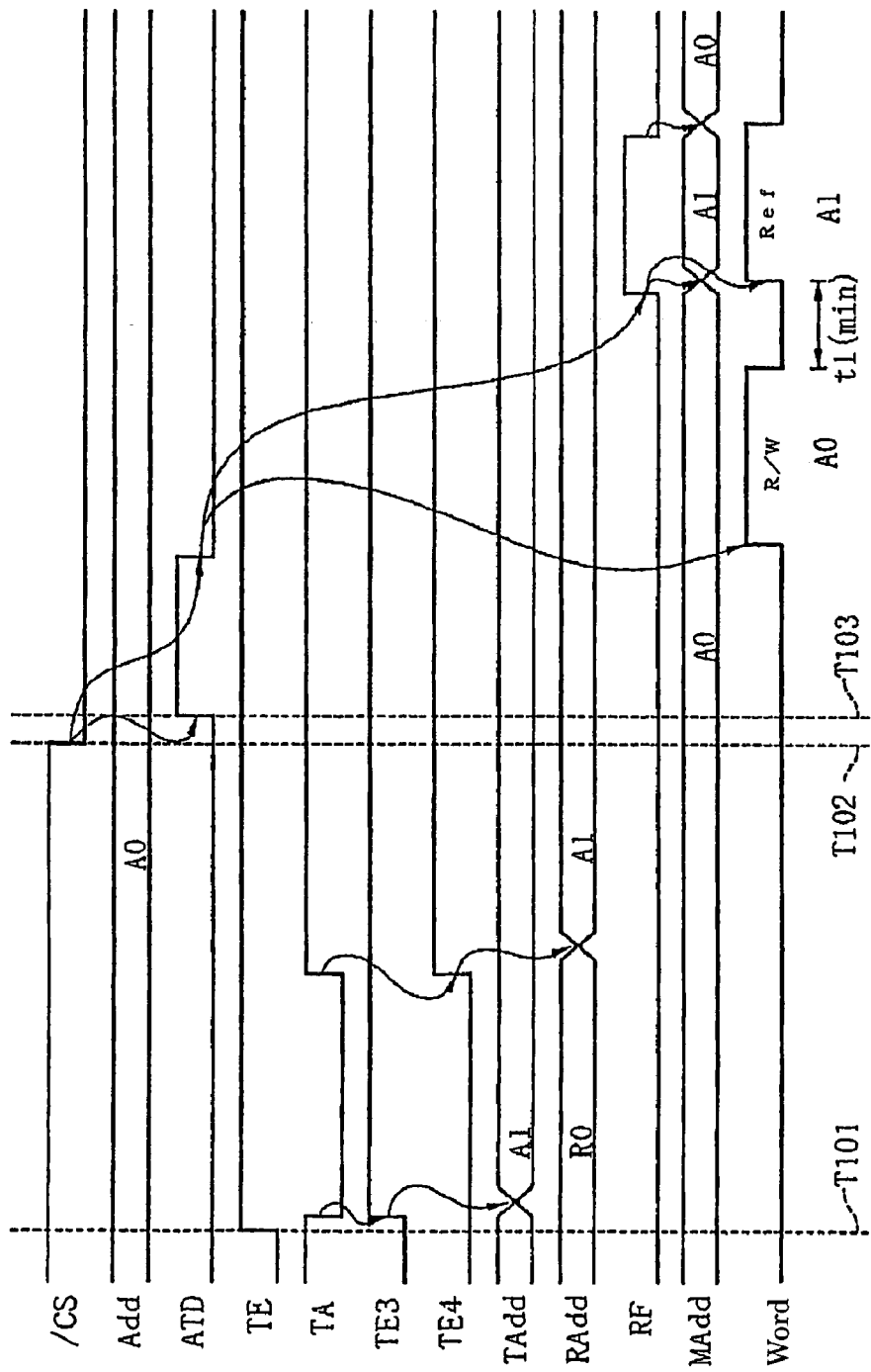
FIG. 14 is a timing chart showing an operation performed in the test mode by the semiconductor memory device shown in FIG. 13.
Figure 15:
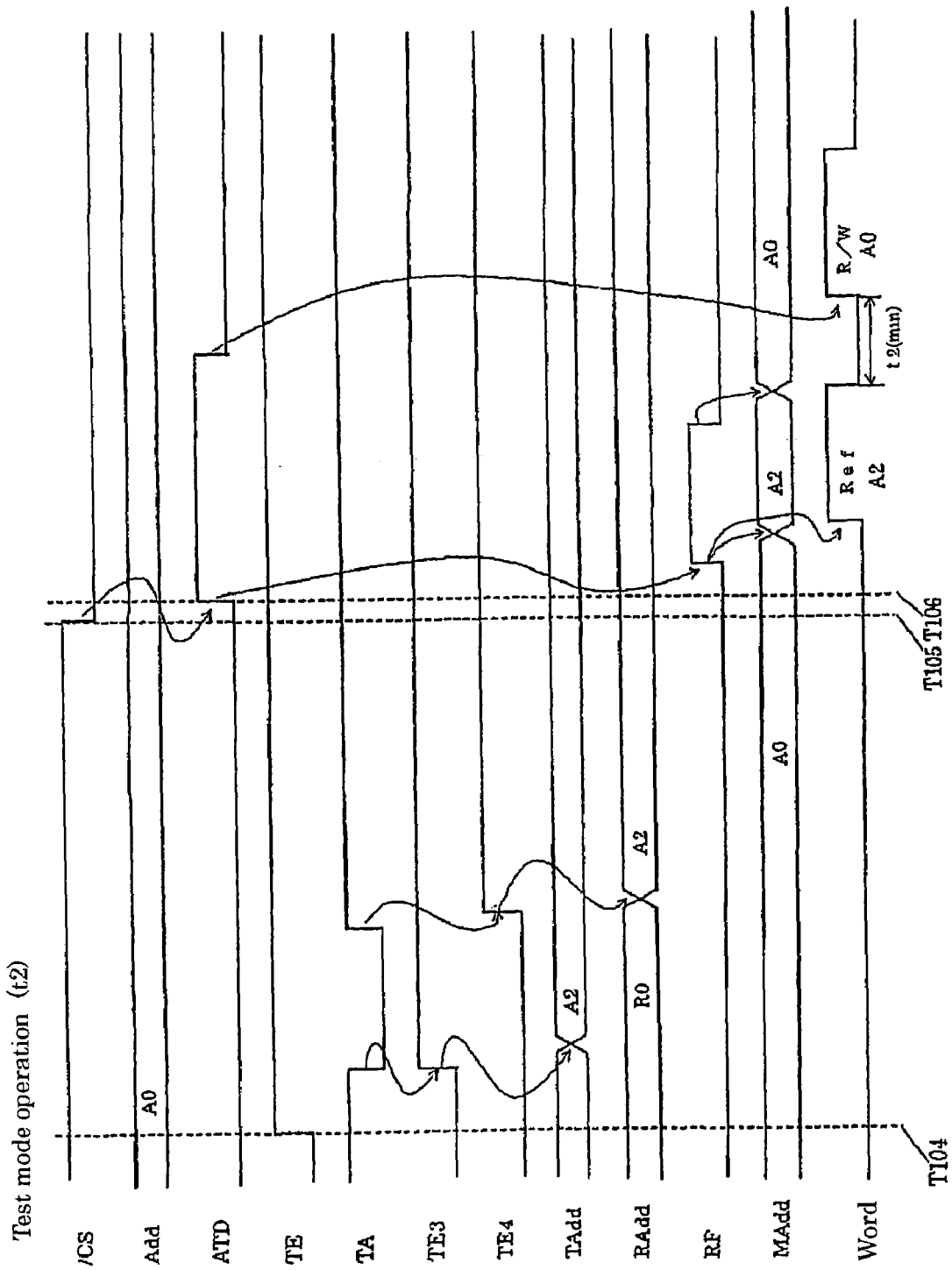
FIG. 15 is a timing chart showing the operation performed in the test mode by the semiconductor memory device shown in FIG. 13.

A fifth embodiment of the present invention will be described below with reference to the drawings. FIG. 13 is a block diagram showing the configuration of a semiconductor memory device according to the fifth embodiment. FIG. 14 is a timing chart showing a test operation performed, under the first worst condition, by the semiconductor memory device shown in FIG. 13. FIG. 15 is a timing chart showing a test operation performed, under the second worst condition, by the semiconductor memory device shown in FIG. 13.

According to the first to fourth embodiments, when the timing for the refresh operation in the test mode is determined, a testing refresh pulse is generated using as a trigger a signal indicating that a change in an externally inputted address has been detected, that is, the address transition detection signal generated by the address transition detecting circuit (ATD circuit) 25. This enables a read or write operation and a refresh operation to be generated by force temporally close to each other.

However, some pseudo SRAMs generate an ATD signal depending on a change of the address as well as an externally inputted signal that selectively activates a selected area of a chip, a bank, or the like, for example, a chip select signal. The input of the chip select signal /CS does not necessarily synchronize with the timing signal TM, generated by the internal timer circuit 50. Consequently, it may be necessary to test the time interval between a refresh operation in the normal operation mode and a read or write operation based on a timing for activating the chip select signal /CS.

In the description of the first to fourth embodiments, the chip select signal /CS is premised to be active. However, in the description below, it is premised that the addresses are not changed but that the chip select signal /CS shifts from an inactive status to an active status. The semiconductor memory device according to the present embodiment is set to be inactive when /CS=1 and to be active when /CS=L. With a fall in the signal /CS, the address transition detecting circuit (ATD circuit) 25 generates an address transition detection signal ATD. The address transition detection signal ATD is then used as a trigger to carry out tests under the first and second worst timing conditions.

Now, the test mode operation will be described. The test mode operation includes a test operation performed under the first worst timing condition and a test operation performed under the second worst timing condition as previously described. FIG. 14 is a timing chart illustrating the test operation performed under the first worst timing condition. FIG. 15 is a timing chart illustrating the test operation performed under the second worst timing condition.

Embodiment 5 is the same as Embodiments 1 to 4 except that an address transition detection signal ATD is generated in response to a fall in the signal /CS (from inactive status to active status).

Specifically, in the test operation performed under the first worst timing condition as shown in FIG. 14, an address transition detection signal ATD is generated in response to a fall in the signal /CS (T103). Then, as in the case of Embodiments 1 to 4, a read or write operation is performed on the memory cell specified by the address A0, and the predetermined time interval t1 later, a refresh operation is performed on the word line specified by the address A1. The example of a test operation shown in FIG. 14 uses an externally inputted refresh address (Embodiment 4). Accordingly, the entry into the test mode (T101), the loading of the refresh address, and the like are carried out using the same procedure as that of Embodiment 4 as shown in FIG. 14.

The test operation performed under the second worst timing condition as shown in FIG. 15 is also similar to that in Embodiments 1 to 4 except that an address transition detection signal ATD is generated in response to a fall in the signal /CS (T105). A read or write operation is performed on the memory cell specified by the address A0, and the predetermined time interval t2 later, a refresh operation is performed on the word line specified by the address A2. The entry into the test mode (T104), the loading of the refresh address, and the like are carried out using the same procedure as that of Embodiment 4 as shown in FIG. 14.

Moreover, the first to fifth embodiments show the example in which the test circuit operating in the test mode is built into the semiconductor memory device. However, the whole circuit of a semiconductor memory device which is composed of a memory cell array and a peripheral circuit may be mounted on a single chip or the whole circuit may be divided into several functional blocks that are mounted on separate chips as required. In the latter case, a mixed IC may be provided; the memory cell array and the peripheral circuit may be mounted on separate chips which are sealed in a single package. That is, the scope of the present invention includes the configuration in which a control chip provided outside a memory chip supplies various control signals to the memory chip.

Further, the present invention is not limited to the configurations of the above embodiments. Many variations may be made to these configurations without departing from the spirit of the present invention.

INDUSTRIAL APPLICABILITY

To ensure that even if a read or write operation and a self refresh operation of a semiconductor memory device which are independent of each other are generated temporally close to each other, the operations are prevented from interfering with each other to cause malfunction, the present invention enables operations of the semiconductor memory device to be checked by providing the device with a predetermined time interval and operating it using this time interval to confirm that malfunction is avoided.

Further, tests are carried out by forcedly generating the worst address condition taking into consideration of relationship between a row address for the read or write operation and the row address for the self refresh operation. This enables the tests to be carried out by generating not only the worst timing condition but also the worst address condition.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

The invention claimed is:

1. A semiconductor memory device, comprising:
a plurality of memory cells to be refreshed;
an address transition detecting circuit that generates an address transition detection signal in response to an input address signal;
a refresh timing generating circuit which generates a normal-operation refresh timing signal independent of the address transition detection signal, in a normal operation mode, and which generates two testing refresh timing signals in response to the address transition detection signal in a test mode;
a testing refresh timing switching circuit that selects one of the two testing refresh timing signals, in response to a refresh timing select signal; and
a refresh address generating circuit that generates a refresh address on the basis of the normal-operation refresh timing signal or the testing refresh timing signal.

2. A semiconductor memory device as claimed in claim 1, wherein either the normal operation mode or the test mode is set in response to an inputted test mode entry signal.

3. A semiconductor memory device as claimed in claim 1, wherein the normal-operation refresh timing signal is generated on the basis of an output signal from a timer circuit operating independently of the address transition detection signal.

4. The semiconductor memory device of claim 1, further comprising:
a refresh timing switching circuit having a first input which is the selected one of the testing refresh timing signals and a second input which is the normal-operation refresh timing signal, said refresh timing switching circuit selecting one of the normal-operation mode refresh timing signal or the selected one of the testing refresh timing signals, in response to a test mode entry signal.

5. A semiconductor memory device as claimed in claim 1, further including:
a memory cell control circuit which accesses a memory cell corresponding to the input address signal in response to the address transition detection signal to execute a read or a write and which carries out refreshing in response to an output signal from the refresh timing generating circuit, and
wherein in the test mode, the refresh timing generating circuit generates the testing refresh timing signal so that in response to the change in the input address signal, the access and the refreshing are carried out with a predetermined time interval.

6. A semiconductor memory device, comprising:
a plurality of memory cells to be refreshed;
an address transition detecting circuit that generates an address transition detection signal in response to an input address signal;
a refresh timing generating circuit which generates a normal-operation refresh timing signal independent of the address transition detection signal, in a normal operation mode, and which generates a testing refresh timing signal in response to the address transition detection signal in a test mode;
a refresh address generating circuit that generates a refresh address on the basis of the normal-operation refresh timing signal or the testing refresh timing signal;
a memory cell control circuit which accesses a memory cell corresponding to the input address signal in response to the address transition detection signal to execute a read or a write and which carries out refreshing in response to an output signal from the refresh timing generating circuit, and
wherein in the test mode, the refresh timing generating circuit generates the testing refresh timing signal so that in response to the change in the input address signal, the access and the refreshing are carried out with a predetermined time interval, and wherein the testing refresh timing signal is set to start the refreshing the predetermined time after the access has been completed.

7. A semiconductor memory device, comprising:
a plurality of memory cells to be refreshed;
an address transition detecting circuit that generates an address transition detection signal in response to an input address signal;
a refresh timing generating circuit which generates a normal-operation refresh timing signal independent of the address transition detection signal, in a normal operation mode, and which generates a testing refresh timing signal in response to the address transition detection signal in a test mode; and
a refresh address generating circuit that generates a refresh address on the basis of the normal-operation refresh timing signal or the testing refresh timing signal, and
wherein the testing refresh timing signal is set to start the access the predetermined time after the refreshing has been completed.

8. A semiconductor memory device, comprising:
a plurality of memory cells to be refreshed;
an address transition detecting circuit that generates an address transition detection signal in response to an input address signal;
a refresh timing generating circuit which generates a normal-operation refresh timing signal independent of the address transition detection signal, in a normal operation mode, and which generates a testing refresh timing signal in response to the address transition detection signal in a test mode;
a refresh address generating circuit that generates a refresh address on the basis of the normal-operation refresh timing signal or the testing refresh timing signal, wherein either the normal operation mode or the test mode is set in response to an inputted test mode entry signal; and
a refresh timing switching circuit that selects either the normal-operation refresh timing signal or the testing refresh timing signal to supply the selected timing signal to the memory cell control circuit, in response to the test mode entry signal.

9. A semiconductor memory device as claimed in claim 8, further including an address switching circuit that selects either the input address signal or the refresh address signal to supply the selected address signal to the memory cell circuit, in response to an output signal from the refresh timing switching circuit.

10. A semiconductor memory device, comprising:
a plurality of memory cells to be refreshed;
an address transition detecting circuit that generates an address transition detection signal in response to an input address signal;
a refresh timing generating circuit which generates a normal-operation refresh timing signal independent of the address transition detection signal, in a normal operation mode, and which generates a testing refresh timing signal in response to the address transition detection signal in a test mode;
a refresh address generating circuit that generates a refresh address on the basis of the normal-operation refresh timing signal or the testing refresh timing signal;
a memory cell control circuit which accesses a memory cell corresponding to the input address signal in response to the address transition detection signal to execute a read or a write and which carries out refreshing in response to an output signal from the refresh timing generating circuit, and
wherein in the test mode, the refresh timing generating circuit generates the testing refresh timing signal so that in response to the change in the input address signal, the access and the refreshing are carried out with a predetermined time interval, and wherein the refresh timing generating circuit generates:
a first testing refresh timing signal set to start the refreshing a first predetermined time after the access to the memory cell has been completed, and
a second testing refresh timing signal set to start the access a second predetermined time after the refreshing has been completed.

11. A semiconductor memory device as claimed in claim 10, further including:
a testing refresh timing switching circuit that selects either the first testing refresh timing signal or the second testing refresh timing signal to supply the selected timing signal to a refresh timing switching circuit, in response to an inputted testing refresh timing select signal.

12. A semiconductor memory device as claimed in claim 9, wherein the refresh address signal is internally generated.

13. A semiconductor memory device as claimed in claim 9, further including a testing refresh address switching circuit that selects either the internally generated address signal or the externally inputted address signal to supply the selected address signal to the address switching circuit, in response to an inputted testing refresh address select signal.

14. A semiconductor memory device, comprising:
a plurality of memory cells to be refreshed;
an address transition detecting circuit that generates an address transition detection signal in response to an input address signal;
a refresh timing generating circuit which generates a normal-operation refresh timing signal independent of the address transition detection signal, in a normal operation mode, and which generates a testing refresh timing signal in response to the address transition detection signal in a test mode;
a refresh address generating circuit that generates a refresh address on the basis of the normal-operation refresh timing signal or the testing refresh timing signal; and
wherein the address transition detection signal is generated in response to a change in an activation control signal which switches the semiconductor memory device from an inactive status to an active status.

15. A test circuit, comprising:
a refresh timing generating circuit that generates a normal-operation refresh timing independent of an access to a memory cell corresponding to an input address signal, and a testing refresh timing responding to the access to the memory cell; and
a refresh timing switching circuit that selects and outputs either the normal-operation refresh timing signal or the testing refresh timing signal in response to an inputted test mode entry signal, wherein the testing refresh timing is set so that the refreshing is started a predetermined time after the access has been completed.

16. A test circuit, comprising:
a refresh timing generating circuit that generates a normal-operation refresh timing independent of an access to a memory cell corresponding to an input address signal, and a testing refresh timing responding to the access to the memory cell;

a refresh timing switching circuit that selects and outputs either the normal-operation refresh timing signal or the testing refresh timing signal in response to an inputted test mode entry signal; and a testing refresh address switching circuit that selects and outputs either an internally generated address signal or an externally inputted address signal in response to an inputted testing refresh address select signal.

17. A method of testing a semiconductor memory device having a plurality of memory cells to be refreshed, the method comprising:

writing a predetermined test pattern in the memory cells;

deselecting a refresh timing independent of an access to a memory cell corresponding to an input address signal and selecting a refresh timing responding to the access;

carrying out the access and refreshing corresponding to the access with a preset time interval;

checking data read from the memory cell against the test pattern to determine whether or not the semiconductor device is acceptable; and using an externally inputted address signal to specify a word line to be refreshed.

18. A semiconductor memory device, comprising:

a plurality of memory cells to be refreshed;

an address transition detecting circuit that generates an address transition detection signal in response to a change in an external address;

a timer circuit that outputs timing signals at fixed time intervals;

a refresh pulse generating circuit that generates and outputs a normal refreshing pulse signal on the basis of the timing signal;

a first testing refresh pulse generating circuit that generates and outputs a first testing refresh pulse signal on the basis of the address transition detection signal;

a first switching circuit that receives at least the normal refreshing pulse signal and the first testing refresh pulse signal to selectively output them on the basis of a test mode entry signal;

a refresh address generating circuit that outputs a refresh address in response to the output of the first switching circuit; and a second switching circuit that selects and outputs either a part of the external address or a part of the refresh address in response to the output of the first switching circuit, the output from the second switching circuit selecting a row of the memory cell array.

19. A semiconductor memory device as claimed in claim 18, wherein a period in which the address transition detection signal is activated does not overlap a period in which the output signal from the first switching circuit is activated.

20. A semiconductor memory device as claimed in claim 18, wherein a period in which the address transition detection signal is activated overlaps a period in which the output signal from the first switching circuit is activated.

21. A semiconductor memory device as claimed in claim 18, further including:

a second testing refresh pulse generating circuit that generates and outputs a second testing refresh pulse signal, having a timing different from that of the first testing refresh pulse signal, on the basis of the address transition detection signal, wherein the first selecting circuit further receives the second testing fresh pulse signal to selectively output the normal refreshing pulse signal and the first and second testing refresh pulse signal on the basis of the test entry signal.

22. A semiconductor memory device as claimed in claim 21, wherein a period in which the output signal from the first switching circuit is activated overlaps a period in which the address transition detection signal is activated, in association with the second testing refresh pulse signal, and wherein the period in which the output signal from the first switching circuit is activated does not overlap the period in which the address transition detection signal is activated, in association with the first testing refresh pulse signal.

* * * * *